United States Patent
Lee et al.

(10) Patent No.: US 9,521,344 B2
(45) Date of Patent: Dec. 13, 2016

(54) IMAGE SENSOR AND METHOD OF PROCESSING IMAGE DATA WITH MULTIPLE DIFFERENTIAL RAMPING UP/DOWN SIGNALS, AND IMAGE PROCESSING DEVICE INCLUDING THE IMAGE SENSOR

(71) Applicants: Jung Ho Lee, Gunpo-Si (KR); Jin Woo Kim, Seoul (KR); Beom Soo Park, Seongnam-Si (KR); Jae Cheol Yun, Seoul (KR)

(72) Inventors: Jung Ho Lee, Gunpo-Si (KR); Jin Woo Kim, Seoul (KR); Beom Soo Park, Seongnam-Si (KR); Jae Cheol Yun, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/338,360

(22) Filed: Jul. 23, 2014

(65) Prior Publication Data
US 2015/0042859 A1  Feb. 12, 2015

(30) Foreign Application Priority Data
Aug. 8, 2013  (KR) .......... 10-2013-0094237

(51) Int. Cl.
*H04N 5/378*  (2011.01)
*H04N 5/357*  (2011.01)
(Continued)

(52) U.S. Cl.
CPC ............ *H04N 5/378* (2013.01); *H04N 5/3575* (2013.01)

(58) Field of Classification Search
CPC ................. H04N 5/378; H04N 5/3575; H03M 1/00–1/645; H03M 5/3355; H03M 5/3745; H03M 5/37455; H03M 5/363; H03M 5/3572
(Continued)

(56) References Cited

U.S. PATENT DOCUMENTS

| 7,321,329 B2 | 1/2008 | Tooyama et al. |
| 7,554,479 B2 | 6/2009 | Lim |

(Continued)

FOREIGN PATENT DOCUMENTS

| EP | 2060005 A0 | 5/2009 |
| JP | 2011082929 | 4/2011 |
| WO | 2008026129 A2 | 3/2008 |

OTHER PUBLICATIONS

Shinichiro Matsuo et al., "8.9-Megapixel Video Image Sensor With 14-b Column-Parallel SA-ADC," IEEE Transactions on Electron Devices, vol. 45, No. 11, Nov. 2009, pp. 2380-2389.
(Continued)

*Primary Examiner* — Tuan Ho
*Assistant Examiner* — Marly Camargo
(74) *Attorney, Agent, or Firm* — Volentine & Whitt, PLLC

(57) ABSTRACT

A method of operating an image sensor includes generating a plurality of ramping up/down signals, and comparing a correlated double sampled pixel signal produced from an output of a pixel with a correlated double sampled first ramping up/down signal among the plurality of ramping up/down signals in a reset interval. The method further includes comparing the correlated double sampled pixel signal with the correlated double sampled first ramping up/down signal at one sampling time or more in an image interval, and a step of outputting a selected ramping
(Continued)

up/down signal among the plurality of ramping up/down signals based on a result of the comparison.

15 Claims, 15 Drawing Sheets

(51) Int. Cl.
  *H04N 5/335* (2011.01)
  *H04N 5/363* (2011.01)
  *H03M 1/12* (2006.01)

(58) Field of Classification Search
  USPC ..... 348/308, 294, 311, 241; 250/208.1, 214, 250/214 R; 341/110, 128, 129, 155
  See application file for complete search history.

(56) References Cited

U.S. PATENT DOCUMENTS

| | | | |
|---|---|---|---|
| 7,804,535 | B2 | 9/2010 | Muramatsu et al. |
| 7,911,519 | B2 | 3/2011 | Saito et al. |
| 7,924,207 | B2 | 4/2011 | Snoeij et al. |
| 7,973,695 | B2* | 7/2011 | Kudo ............ H03M 1/12 341/169 |
| 8,149,289 | B2 | 4/2012 | Lim et al. |
| 2002/0067303 | A1* | 6/2002 | Lee ............ H04N 5/335 341/184 |
| 2009/0195431 | A1* | 8/2009 | Snoeij ............ H03M 1/12 341/155 |
| 2011/0019025 | A1 | 1/2011 | Koseki |
| 2012/0008028 | A1 | 1/2012 | Egawa |
| 2012/0038809 | A1 | 2/2012 | Lee et al. |
| 2012/0050082 | A1 | 3/2012 | Danesh et al. |
| 2012/0194367 | A1 | 8/2012 | Wang |
| 2014/0240568 | A1* | 8/2014 | Yamagata ............ H04N 5/378 348/308 |

OTHER PUBLICATIONS

Seunghyun Lim et al., "A High-Speed CMOS Image Sensor With Column-Parallel Two-Step Single-Slope ADCs," IEEE Transactions on Electron Devices, vol. 56, No. 3, Mar. 2009, pp. 393-398.

Martijn F. Snoeij et al., "Multiple-Ramp Column-Parallel ADC Architectures for CMOS Image Sensors," IEEE Journal of Solid-State Circuits, vol. 42, No. 12, Dec. 2007, pp. 2968-2977.

Takushi Oyama et al., "High Speed Single Slope ADC with special Ramp Control," Samsung Electronics Patent (not registered) IB-201111-528-1, Nov. 2011.

Shoji Kawahito et al., "Column Parallel Signal Processing techniques for Reducing thermal and RTS Noises in CMOS Image Sensors," pp. 226-229, Jun. 2007.

Shoji Kawahito et al., "Noise Reduction Effects of Column-Parallel Correlated Multiple Sampling and Source-Follower Driving Current Switching for CMOS Image Sensors," International Image Sensor Workshop, Jun. 2009.

Yong Lim et al., "A 1.1e: Temporal Noise 1/3.2-inch 8Mpixel CMOS Image Sensor using Pseudo-Multiple Sampling," ISSCC Digest of Technical Papers, pp. 396-398, Feb. 2010.

* cited by examiner (a)

(b)

(a)

(b)

IMAGE SENSOR AND METHOD OF PROCESSING IMAGE DATA WITH MULTIPLE DIFFERENTIAL RAMPING UP/DOWN SIGNALS, AND IMAGE PROCESSING DEVICE INCLUDING THE IMAGE SENSOR

CROSS-REFERENCE TO RELATED APPLICATIONS

This application claims priority under 35 U.S.C. §119 from Korean Patent Application No. 10-2013-0094237 filed on Aug. 8, 2013, the disclosure of which is hereby incorporated by reference in its entirety.

BACKGROUND

Embodiments of the present inventive concept relate to a complementary metal oxide semiconductor image sensor (CIS), and more particularly to: an image sensor which may perform a fast operation by using one of differential ramping up/down signals, applying a correlated double sampling to a pixel signal, and reducing an entire analog-to-digital conversion time; an operation method thereof; and devices having the image sensor.

As an analog-to-digital conversion method of an image sensor, a single-slope analog digital converting method is widely used. The method compares a ramping signal with a pixel signal having a constant voltage level, and converts timing or time when a voltage level of the ramping signal equals to a voltage level of the pixel signal according to a result of the comparison into a digital signal.

In a column parallel analog-to-digital conversion method, one column analog-to-digital converter needs to be integrated in one pixel pitch, so that the single slope analog-to-digital conversion method is widely used in consideration of layout area and power consumption. Recently, as the number of pixels of an image sensor has dramatically increased, a demand for a fast operation of the image sensor has also increased.

SUMMARY

An aspect of the present invention is directed to a method of operating an image sensor comprising a plurality of pixels, including: generating a plurality of ramping up/down signals, and comparing a correlated double sampled pixel signal produced from a pixel signal output from a pixel in a reset interval with a correlated double sampled first ramping up/down signal among the plurality of ramping up/down signals. In some embodiments, the method of operating the image sensor further may include comparing the correlated double sampled pixel signal with the correlated double sampled first ramping up/down signal at one or more sampling times after the reset interval and before an image interval, and outputting a selected ramping up/down signal among the plurality of ramping up/down signals based on a result of the comparison. In some embodiments the selected ramping up/down signal is the first ramping up/down signal. In some embodiments, the selected ramping up/down signal is a second first ramping up/down signal which is different from the first ramping up/down signal.

In some embodiments, at least two signals among the plurality of ramping up/down signals may be differential signals. In some variations of these embodiments, each pair of corresponding differential ramping up/down signals among the plurality of ramping up/down signals may be generated by a different ramping up/down signal generator.

Another aspect of the present inventive concepts is directed to a device comprising an image sensor. The image sensor includes a pixel generating a pixel signal, and a signal processing circuit which performs a first correlated double sampling (CDS) operation on the pixel signal using a first ramping up/down signal among a plurality of ramping up/down signals in a reset interval, and performs a second CDS operation on the pixel signal using a selected ramping up/down signal among the plurality of ramping up/down signals in an image interval. In some embodiments, the selected ramping up/down signal is the first ramping up/down signal. In some embodiments, the selected ramping up/down signal is a second first ramping up/down signal which is different from the first ramping up/down signal.

In some embodiments, the signal processing circuit includes a signal generator which generates the plurality of ramping up/down signals, a selection circuit which outputs the selected ramping up/down signal in response to at least one control signal, and a CDS circuit which performs a third CDS operation on the pixel signal with the first ramping up/down signal at one or more sampling times between the reset interval and the image interval, wherein the signal processing circuit generates the at least one control signal according to a result of the comparison. In some embodiments, the signal generator includes a plurality of ramping up/down signal generators which generates a pair of corresponding differential ramping up/down signals among the plurality of ramping up/down signals, respectively.

Another aspect of the present inventive concepts is directed to an image processing device, including the image sensor and an image signal processor which processes an output signal of the image sensor. A portable electronic device according to an example embodiment of the present inventive concepts includes the image sensor and an application processor which controls the image sensor.

Another embodiment of the present inventive concepts is directed to a signal processing device for processing a pixel signal produced by a pixel of an image sensor. The signal processing device may comprise: a signal generator configured to generate a plurality of ramping up/down signals; a selection circuit configured to receive the plurality of ramping up/down signals and to output a selected ramping up/down signal among the plurality of ramping up/down signals in response to at least one control signal; and a correlated double sampling circuit configured to perform a correlated double sampling operation on the pixel signal and the selected ramping up/down signal, and to output a correlated double sampled output signal having a first level when a correlated double sampled pixel signal is greater than a correlated double sampled selected ramping up/down signal, and to output the correlated double sampled output signal having a second level when the correlated double sampled pixel signal is less than the correlated double sampled selected ramping up/down signal. The correlated double sampling circuit is configured to perform the correlated double sampling operation on the pixel signal and the selected ramping up/down signal, and to output the correlated double sampled output signal, at least once between a reset interval of the pixel and an image interval of the pixel, and is further configured to perform the correlated double sampling operation of the pixel signal and the selected ramping up/down signal at least once during the image interval of the sensor. The correlated double sampled output signal which is output by the correlated double sampling circuit between the reset interval of the pixel and the image interval of the pixel generates the at least one control signal for the selection circuit while the correlated double sampling circuit performs the correlated double sampling operation on the pixel signal and the selected ramping up/down signal during the image interval of the pixel.

In some embodiments, the signal processing device further comprises: a comparator connected to receive the correlated double sampled output signal from the correlated double sampling circuit and to receive a reference voltage, and which is configured to compare the correlated double sampled output signal to the reference voltage and to output a comparison signal in response to the comparison; and a memory device configured to receive and latch the comparison signal, and to output the comparison signal as the at least one control signal.

In some variations of these embodiments, the signal processing device further comprises a counter connected to receive the comparison signal and to count a time period between a start of the image interval and a transition of the comparison signal from a first level to a second level as a result of the comparison.

In some embodiments, the correlated double sampling circuit is configured to perform the correlated double sampling of the pixel signal and the selected ramping up/down signal, and to output the correlated double sampled output signal, at least twice between the reset interval of the pixel and the image interval of the pixel.

In some embodiments, at least one of the ramping up/down signals comprises a signal which has a ramp-up portion and a ramp-down portion during the image interval.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which.

DETAILED DESCRIPTION OF THE EMBODIMENTS

Figure 1:
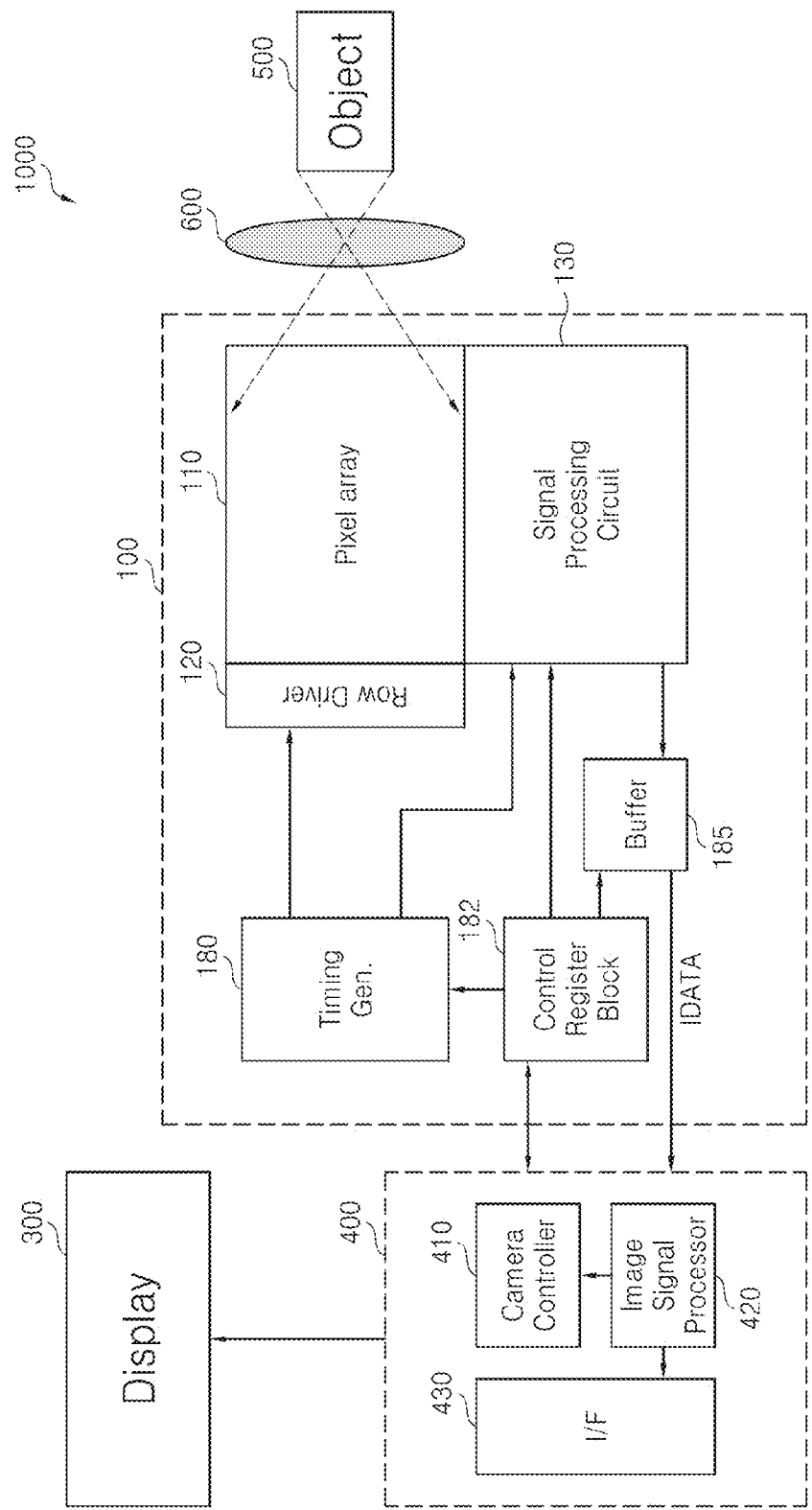
FIG. 1 is a schematic block diagram of an image processing device according to an example embodiment of the present inventive concepts.

The present inventive concepts now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Figure 6:
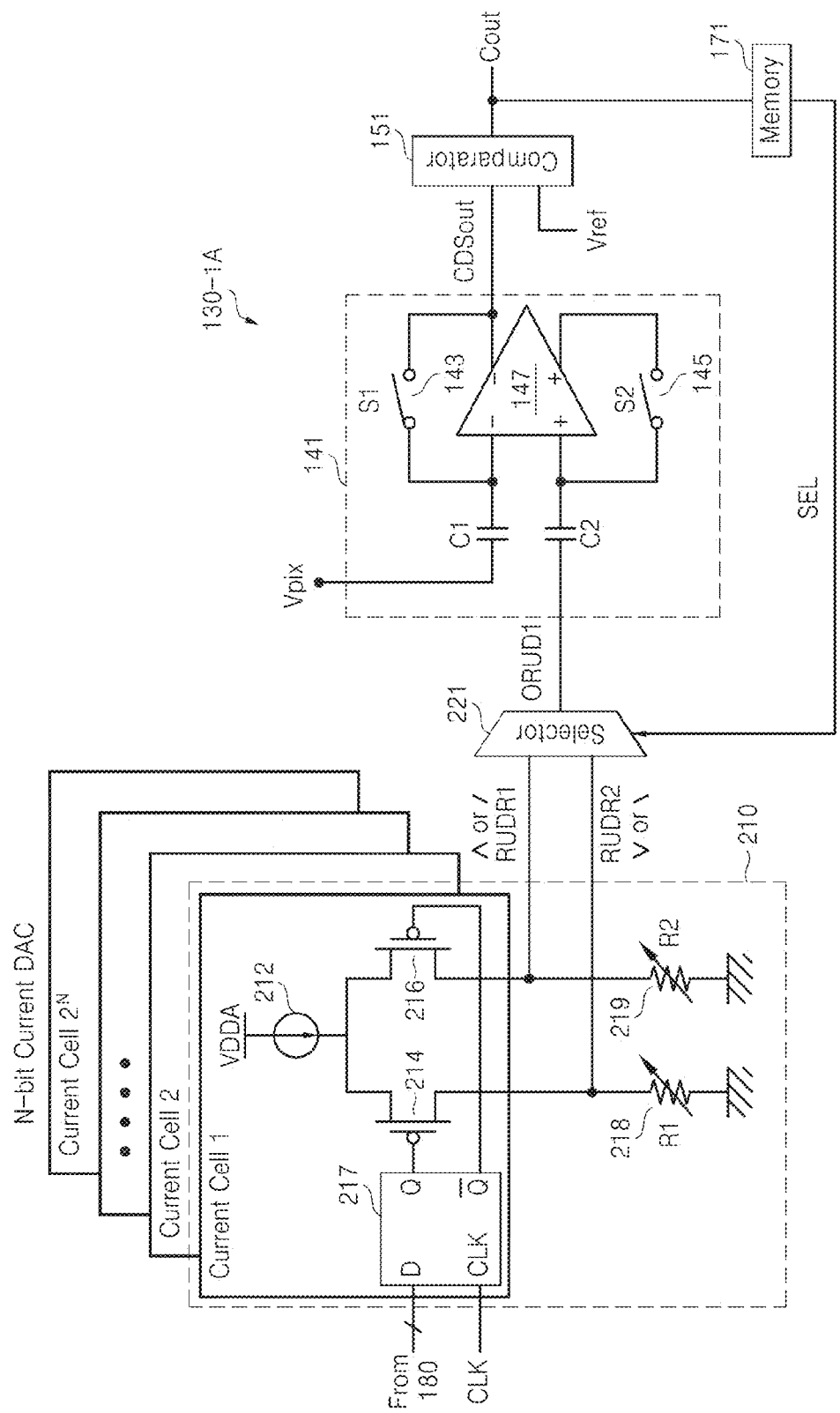
FIG. 6 is an example embodiment of a circuit diagram for the portion of the signal processing circuit illustrated in FIG. 5.
Figure 7:
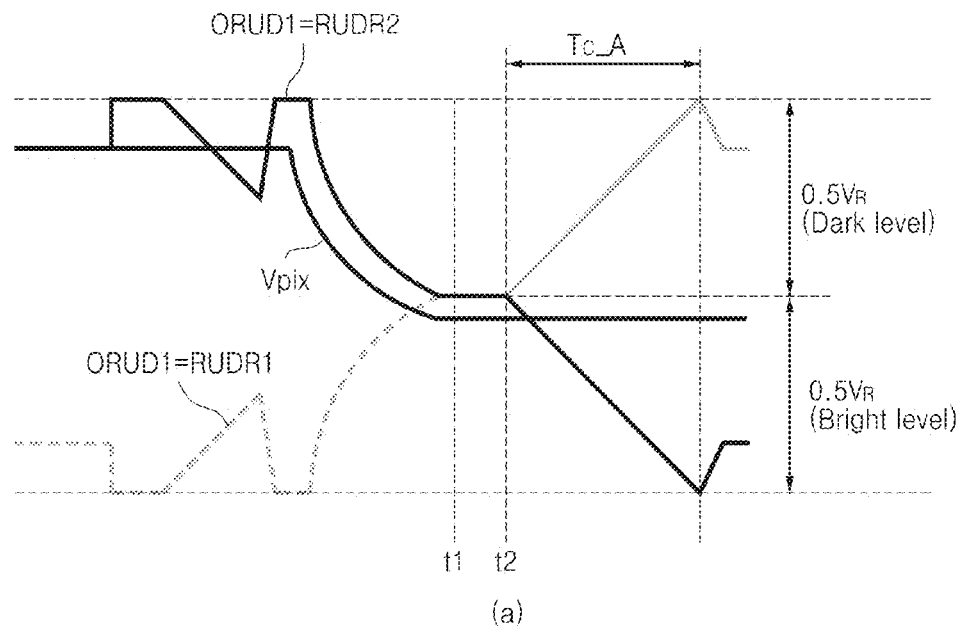
FIG. 7A and FIG. 7B are example embodiments of timing diagrams for describing an operation of the portion of the signal processing circuit illustrated in FIG. 6.
Figure 7:
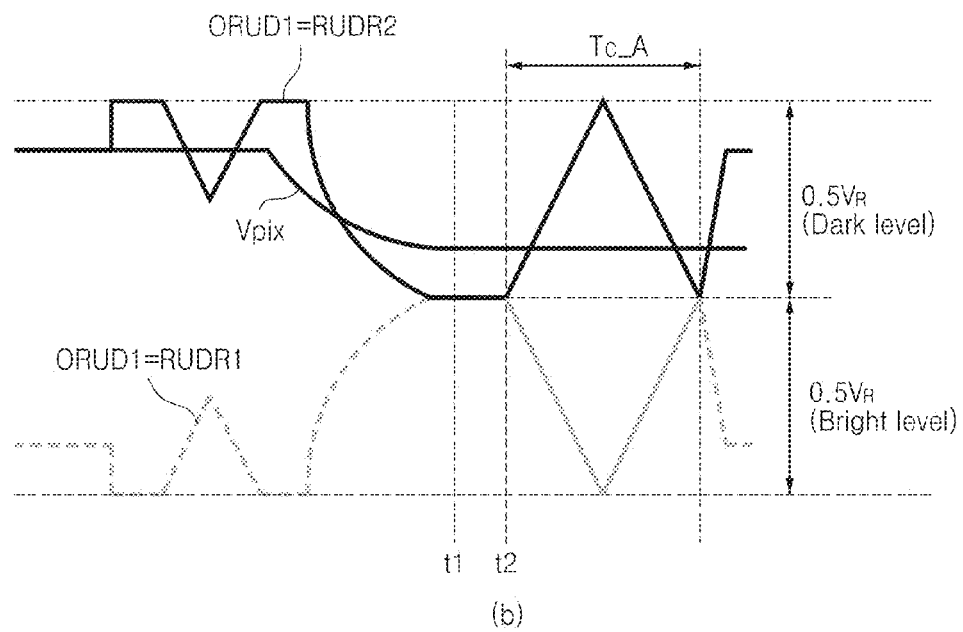
Figure 10:
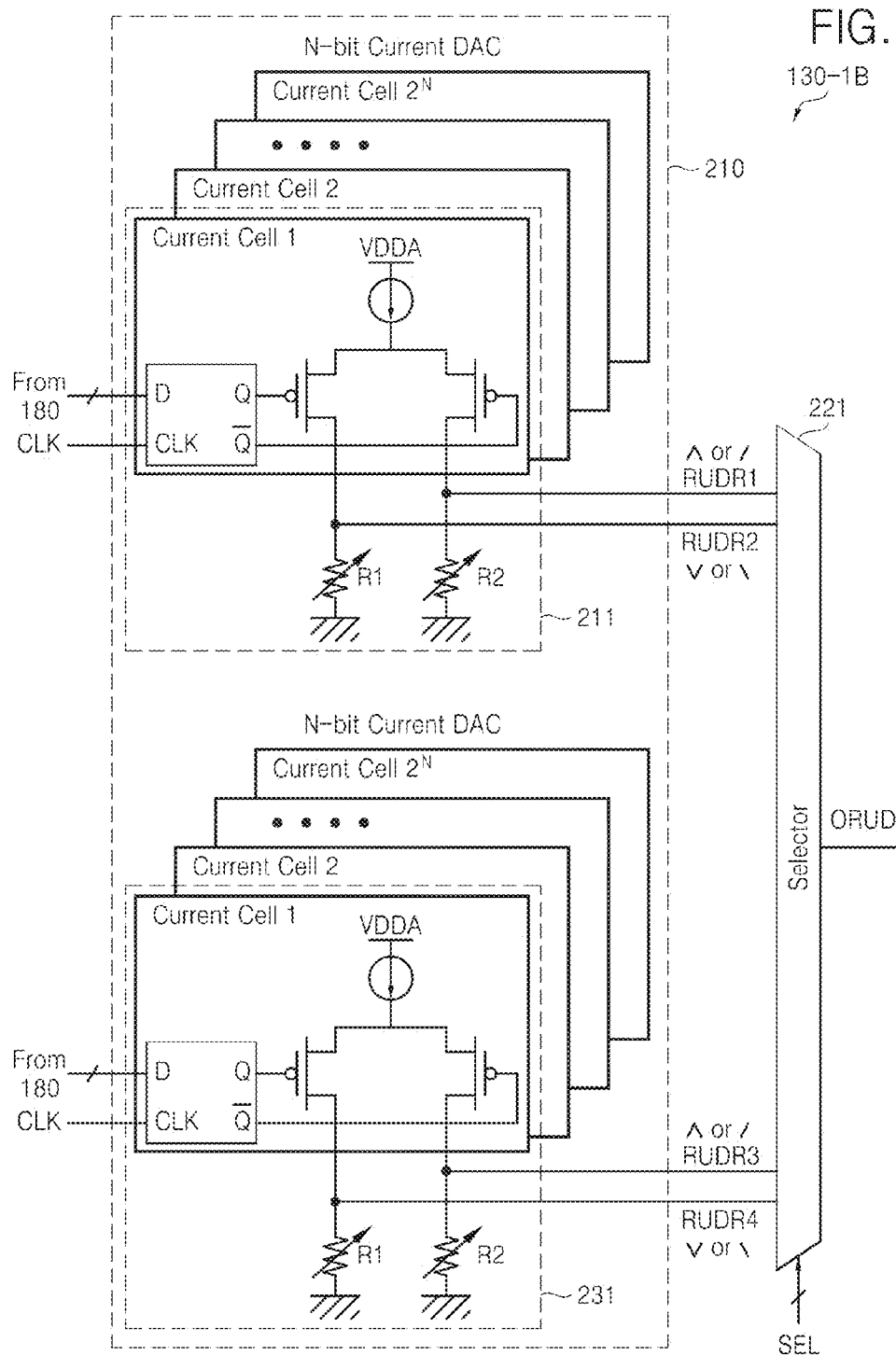
FIG. 10 is another example embodiment of a circuit diagram for the portion of the signal processing circuit illustrated in FIG. 5.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein A ramping up/down signal in this specification may be defined as a signal with a waveform in a "∧" shape or in a "/" shape as illustrated in FIG. 6 or 10. Additionally, a complementary ramping up/down signal may be defined as a signal with a waveform in a "∨" shape or in a "\" shape as illustrated in FIG. 6 or 10.

Moreover, a coarse bit may be a signal which corresponds to a result of comparing a pixel signal with a ramping up/down signal, which is stored in a storage device, e.g., a memory, so as to select the ramping up/down signal or the complementary ramping up/down signal according to the result of the comparison.

FIG. 1 is a schematic block diagram of an image processing device according to an example embodiment of the present inventive concepts. Referring to FIG. 1, an image processing device 1000 may be embodied in a portable electronic device, e.g., a digital camera, a mobile phone, a smart phone, a tablet personal computer (PC), a personal digital assistant (PDA), a wearable computer, or a mobile internet device (MID).

Image processing device 1000 includes a CMOS image sensor 100, a display 300, a digital signal processor 400, and an optical lens 600. CMOS image sensor 100 generates image data IDATA of a subject 500, for example incident through optical lens 600. According to some example embodiments, image processing device 1000 may not include optical lens 600.

CMOS image sensor 100 includes a pixel array 110, a row driver 120, a signal processing circuit 130, a timing generator 180, a control register block 182, and a buffer 185.

CMOS image sensor 100 senses subject 500, for example captured or incident through optical lens 600, and generates image data IDATA corresponding to a result of the sensing according to a control of digital signal processor (DSP) 400. DSP 400 may output image signals corresponding to the image data IDATA output from CMOS image sensor 100 to a display 300.

DSP 400 includes a camera controller 410, an image signal processor (ISP) 420, and an interface (I/F) 430.

Camera controller 410 controls an operation of a control register block 182. Camera controller 410 may control an operation of CMOS image sensor 100, e.g., control register block 182, by using a protocol, e.g., inter-integrated circuit ($I^2C$); however, a technical concept of the invention is not limited thereto. Control register block 182 may control an operation of signal processing circuit 130, timing generator 180, and buffer 185. ISP 420 receives image data IDATA output from buffer 185, processes the received image data IDATA, and outputs the processed image data to display 300 through I/F 430.

FIG. 1 illustrates ISP 420 is located in the DSP 400; however, ISP 420 may be located inside CMOS image sensor 100 according to an example embodiment. Besides, CMOS image sensor 100 and ISP 420 may be embodied in one package, e.g., a multi-chip package (MCP) or a package on package (PoP).

Figure 2:
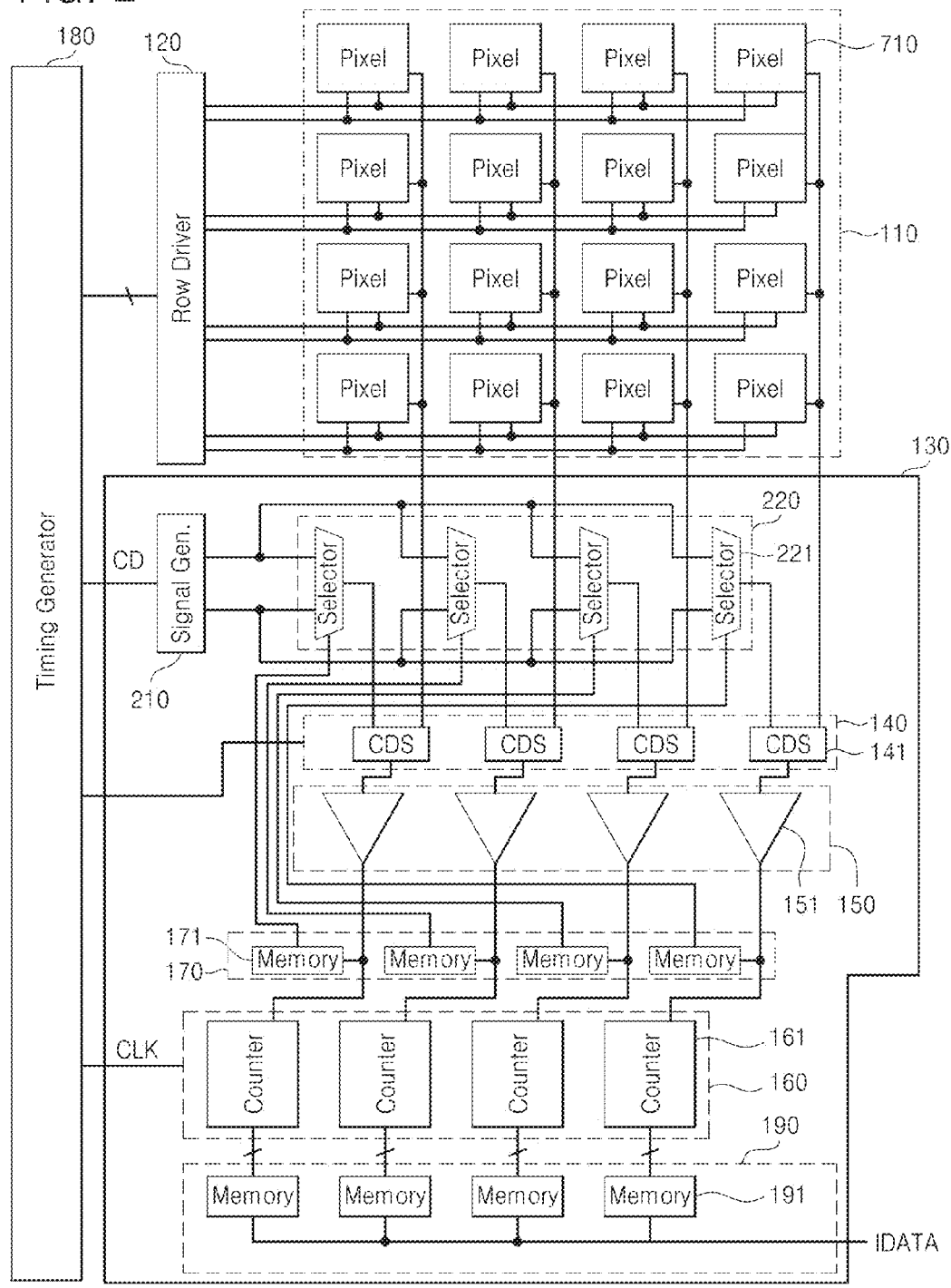
FIG. 2 is a detailed block diagram of a CMOS image sensor illustrated in FIG. 1.

FIG. 2 is a detailed block diagram of CMOS image sensor 100 illustrated in FIG. 1. Referring to FIGS. 1 and 2, signal processing circuit 130 includes a correlated double sampling (CDS) block 140, a comparator block 150, a counter block 160, a first memory block 170, a second memory block 190, a signal generator 210, and a selector block 220. Here, a block may be a circuit.

Pixel array 110 includes a plurality of pixels 710. Each of the plurality of pixels 710 includes a photo sensing element (or a photo-electric conversion element) and a readout circuit outputting a pixel signal corresponding to charges generated by the photo sensing element. For example, the photo sensing element may be embodied in a photodiode, a photo gate, or a pinned photo diode.

Row driver 120 may control an operation of each of the plurality of pixels 710. Row driver 120 may drive pixel array 110 by row. For example, row driver 120 may generate a selection signal which may select a plurality of pixels included in one of a plurality of rows. According to the selection signal, a pixel signal output from each of the plurality of pixels is transmitted to signal processing circuit 130.

Timing generator 180 may generate at least one control signal for controlling an operation of at least one of row driver 120, CDS block 140, signal generator 210, counter block 160, first memory block 170, and second memory block 190.

CDS block 140 includes a plurality of CDS circuits 141. Each of the plurality of CDS circuits 141 performs CDS on a pixel signal output from each of the plurality of pixels 710 by using a ramping up/down signal or a complementary ramping up/down signal output from selector block 220. Here, a first CDS circuit 141 may perform the CDS using at least one capacitor C1 and C2 exemplarily illustrated in FIG. 6.

Comparator block 150 includes a plurality of comparators 151. Each of the plurality of comparators 151 compares a corresponding CDS output signal with a reference signal, and outputs a comparison signal. Counter block 160 includes a plurality of counters 161.

Each of the plurality of counters 161 counts phase change time (or phase transition time) of a comparison signal output from each of the plurality of comparators 151, and outputs a count signal by using a clock signal CLK.

First memory block 170 includes a plurality of first memories 171. Each of the plurality of first memories 171 receives and stores a comparison signal output from each of the plurality of comparators 151. Each of the plurality of first memories 171 may be embodied in a flip-flop. Second memory block 190 includes a plurality of second memories 191. Each of the plurality of second memories 191 receives and stores a count signal output from each of the plurality of counters 161. For example, image data IDATA may correspond to a count signal output from each of the plurality of second memories 191.

In response to at least one control bit CD output from timing generator 180, signal generator 210 may generate a plurality of ramping up/down signals and/or a plurality of complementary ramping up/down signals.

Selector block 220 includes a plurality of selectors 221. Each of the plurality of selectors 221 may output one of the plurality of ramping up/down signals and the plurality of complementary ramping up/down signals in response to at least one selection signal output from each of the plurality of first memories 171.

Figure 3:
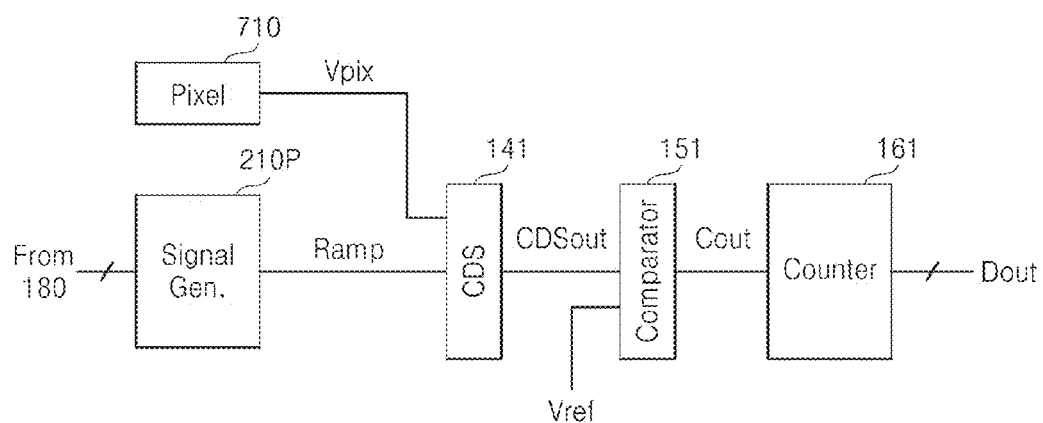
FIG. 3 is a schematic block diagram of a conventional signal processing circuit.

FIG. 3 is a schematic block diagram of a conventional signal processing circuit for a conventional signal-column analog-to-digital conversion. As shown in FIG. 3, unlike signal processing circuit 130 of FIG. 2, the conventional signal processing circuit of FIG. 3 employs signal generator 210P instead of signal generator 210, and omits selector block 220 and first memory block 170. CDS circuit 141 performs a correlated double sampling (CDS) on a pixel signal Vpix output from pixel 710 and a ramp signal Ramp output from signal generator 210P, compares the correlated double sampled pixel signal with the correlated double sampled ramp signal, and outputs a correlated double sampled output signal CDSout corresponding to a result of the comparison.

Comparator 151 having a single-ended input compares the correlated double sampled output signal CDSout with a reference signal Vref, and outputs a comparison signal Cout corresponding to a result of the comparison. The reference signal may be a ground or fixed voltage.

Counter 161 converts a time when a level of the comparison signal Cout transitions into a digital signal Dout and outputs the digital signal Dout by using a clock signal.

FIGS. 4A and 4B are timing diagrams for describing an operation of the conventional signal processing circuit illustrated in FIG. 3. FIG. 4A is a waveform of a pixel signal Vpix and a down ramp signal Ramp used in the conventional signal-column analog-to-digital conversion. Counter 161 of FIG. 3 performs a count operation in a conversion interval TC which is also the image interval for pixel array 110. VR denotes a magnitude of down ramp signal Ramp changing in the conversion interval TC, and VR may be proportional to the conversion interval TC.

FIG. 4B is a waveform of the pixel signal Vpix and a down & up ramp signal Ramp used in the conventional signal-column analog-to-digital conversion. A conversion interval TC and VR in FIG. 4B are the same as the conversion interval TC and the VR in FIG. 4A. A technical concept of the invention aims to provide a CMOS image sensor performing an analog-to-digital conversion at a high speed by reducing the conversion interval TC and the VR illustrated in FIGS. 4A and 4B.

Figure 5:
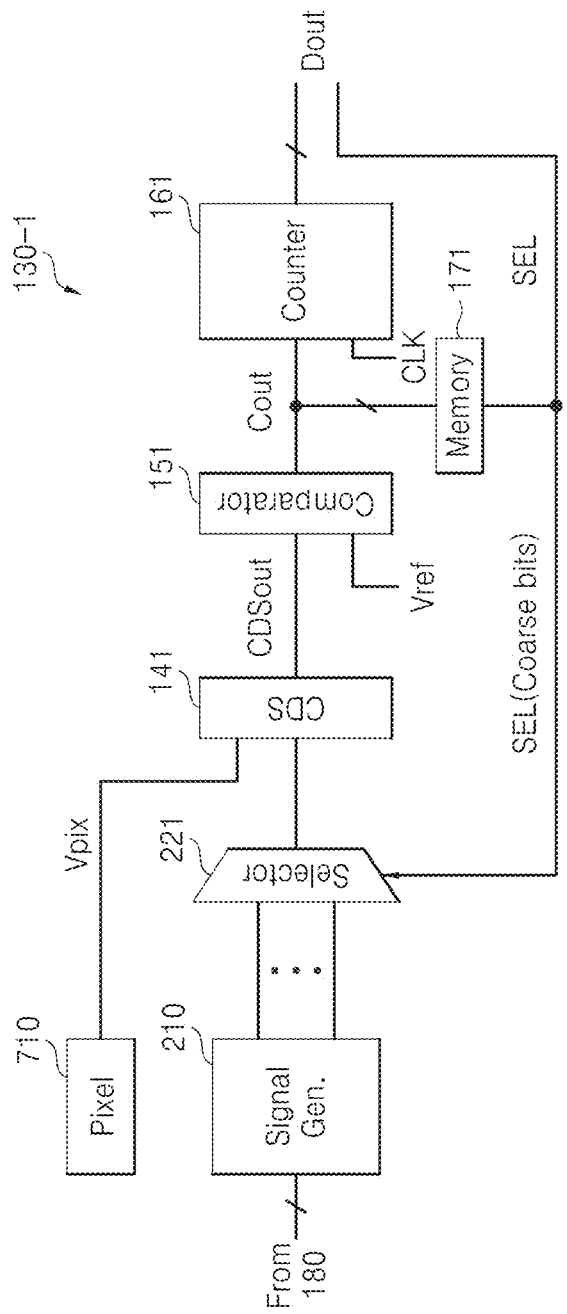
FIG. 5 illustrates a portion of the signal processing circuit illustrated in FIG. 1.

FIG. 5 illustrates a portion 130-1 of the signal processing circuit illustrated in FIG. 1. For convenience of description in FIG. 5, signal processing circuit portion 130-1 of signal processing circuit 130 which processes the pixel signal Vpix output through one column is illustrated.

Signal processing circuit portion 130-1 includes first CDS circuit 141, first comparator 151, first counter 161, first memory 171, signal generator 210, and first selector 221. A structure illustrated in FIG. 5 is in a digital CDS method using a column-parallel analog-to-digital conversion method. Referring to FIGS. 3 and 5, signal processing circuit portion 130-1 further includes first memory 171, signal generator 210, and first selector 221 compared to a circuit for the conventional single-column analog-to-digital conversion.

Signal generator 210 generates a plurality of ramping up/down signals and a plurality of complementary ramping up/down signals in response to at least one control bit output from timing generator 180.

First selector 221 outputs one of the plurality of ramping up/down signals and the plurality of complementary ramping up/down signals output from signal generator 210 to first CDS circuit 141. First CDS circuit 141 performs CDS on each of the pixel signal Vpix output from pixel 710 and an output signal of first selector 221 in a particular time interval, which may be a reset interval or an image interval. Here, an image interval means a time interval when the pixel voltages which are responsive to an image which is being sensed or detected by pixel array 110 are being read out from pixels 710, and a reset interval means a time interval between image intervals when pixel voltages of pixels 710 are being reset to a nominal level.

First comparator 151 compares a correlated double sampled output signal CDSout output from first CDS circuit 141 with a reference signal Vref in the particular time interval, and outputs a comparison signal Cout according to a result of the comparison. The comparison signal Cout may collectively represent each comparison signal Cout1, Cout2, Cout3, and Cout4 to be described in FIGS. 12 and 13.

An embodiment of comparator 151 having a single-ended input is illustrated in FIG. 5; however, comparator 151 may be replaced with a differential amplifier. Here, first CDS circuit 141 may be replaced with a CDS circuit outputting differential correlated double sampled signals.

First counter 161 counts level transition time of the comparison signal Cout output from first comparator 151 by using a clock signal CLK, and outputs a counted value Dout. The counted value Dout may be a digital value.

First memory 171 receives and stores a comparison signal Cout. For example, when a level of a ramping up/down signal output from first selector 221 is greater than a level of the pixel signal Vpix, then first memory 171 stores a comparison signal Cout having a first level, e.g., a value of "1", and when the level of the ramping up/down signal is less than the level of the pixel signal Vpix, then first memory 171 stores a comparison signal Cout having a second level, e.g., a value of "0".

A value stored in first memory 171 may be used as a selection signal SEL.

FIG. 6 is an example embodiment of a circuit diagram for the portion of the signal processing circuit illustrated in FIG. 5. Referring to FIGS. 5 and 6, a first current cell Current Cell 1 of signal generator 210 in one embodiment 130-1A for signal processing circuit portion 130-1, illustrated in FIG. 5, of signal processing circuit 130 includes a current source 212, a transistor pair 214 and 216, a D-flip flop 217, and a plurality of resistances 218 and 219. For example, signal generator 210 may be embodied in a current steering digital-to-analog converter array.

Current source 212 supplies a bias current of the signal generator 210. D-flip flop 217 latches a control bit output from timing generator 180 in response to a clock signal CLK.

Transistor pair 214 and 216 operate in response to complementary signals Q and /Q output from D-flip flop 217. That is, signal generator 210 generates a first ramping up/down signal RUDR1 and a second ramping up/down signal RUDR2 in response to a control bit output from timing generator 180. For example, the first ramping up/down signal RUDR1 outputs a waveform in a "∧" shape or a "/" shape, and the second ramping up/down signal RUDR2 outputs a waveform in a "∨" shape or in a "\" shape. Here, the first ramping up/down signal RUDR1 and the second up/down signal RUDR2 may be complementary signals or differential signals.

Each resistance value R1 and R2 of a plurality of resistances 218 and 219 may be designed to be the same as each other or to be different from each other. For example, each of the plurality of resistances 218 and 219 may be provided as a variable resistance.

Signal generator 210 may further include at least one current cell having the same structure as the first current cell Current Cell 1. A first output terminal of each current cell may be connected to each other, and a second output terminal of the each current cell may be connected to each other.

First selector 221 may output a selected one of the first ramping up/down signal RUDR1 and the second ramping up/down signal RUDR2 as an output ramping up/down signal ORUD1 in response to a selection signal SEL output from first memory 171. For example, when the selection signal SEL is one bit, first selector 221 may output the first ramping up/down signal RUDR1 in response to the selection signal SEL having a first level (e.g., "0"), and may output the second ramping up/down signal RUDR2 in response to the selection signal SEL having a second level (e.g., "1").

The first capacitor C1 may level-shift a pixel signal Vpix output from pixel 710 through AC coupling, and may sample an offset of first CDS circuit 141 at the same time. The second capacitor C2 may level-shift an output ramping up/down signal ORUD1 output from first selector 221 through the AC coupling, and may sample the offset of first CDS circuit 141 at the same time.

For example, the first capacitor C1 stores a difference between: the correlated double sampled pixel signal; and an input common-mode voltage of first CDS circuit 141 and the offset voltage of first CDS circuit 141. The second capacitor C2 stores a difference between: the correlated double sampled output ramping up/down signal ORUD1; and an input common mode voltage of first CDS circuit 141 and the offset voltage of first CDS circuit 141. First comparator 151 may perform a comparison operation M times (where M is a natural number) before an image interval for pixels 710, and output a comparison signal Cout as a result of the comparison operation.

An example of a case where M is equal to 1 will be described referring to FIGS. 6 to 9.

In this example, before the image interval SC (see FIG. 8), an amplifier 147 of first CDS circuit 141 compares the correlated double sampled ramping up/down signal with the correlated double sampled pixel signal, and outputs a correlated double sampled output signal CDSout according to a result of the comparison. First comparator 151 compares the correlated double sampled output signal CDSout of first CDS circuit 141 with a reference signal Vref once and outputs a one-bit coarse bit, corresponding to a result of the comparison, as a comparison signal Cout.

The coarse bit is stored in first memory 171 as the selection signal SEL and simultaneously output to first counter 161. First CDS circuit 141 includes the first capacitor C1, the second capacitor C2, a first switch 143, a second switch 145, and the amplifier 147. Each switch 143 and 145 is switched in response to each switching signal S1 and S2.

First CDS circuit 141 amplifies a difference between a pixel signal correlated double sampled by the first capacitor C1 and an output ramping up/down signal correlated double sampled by the second capacitor C2, and outputs the correlated double sampling output signal CDSout. The first comparator 151 compares the correlated double sampled output signal CDSout of first CDS circuit 141 with the reference signal Vref, and outputs the comparison signal Cout.

In the image interval SC, first CDS circuit 141 amplifies and outputs a difference between the pixel signal correlated double sampled by the first capacitor C1, and the ramping up/down signal correlated double sampled by the second capacitor C2.

First comparator 151 compares the correlated double sampled output signal CDSout of first CDS circuit 141 with the reference signal Vref, and outputs a comparison signal Cout according to a result of the comparison. As the result of the comparison, when a level of the second ramping up/down signal RUDR2 is greater than a level of the pixel signal Vpix, the comparison signal Cout having a value of "1" is stored in first memory 171, and when the level of the second ramping up/down signal RUDR2 is less than the level of the pixel signal Vpix, the comparison signal Cout having a value of "0" is stored in first memory 171.

First selector 221 outputs the first ramping up/down signal RUDR1 or the second ramping up/down signal RUDR2 according to a value stored in first memory 171, e.g., 0 or 1, and output as a selection signal SEL ("coarse bit(s)").

Figure 8:
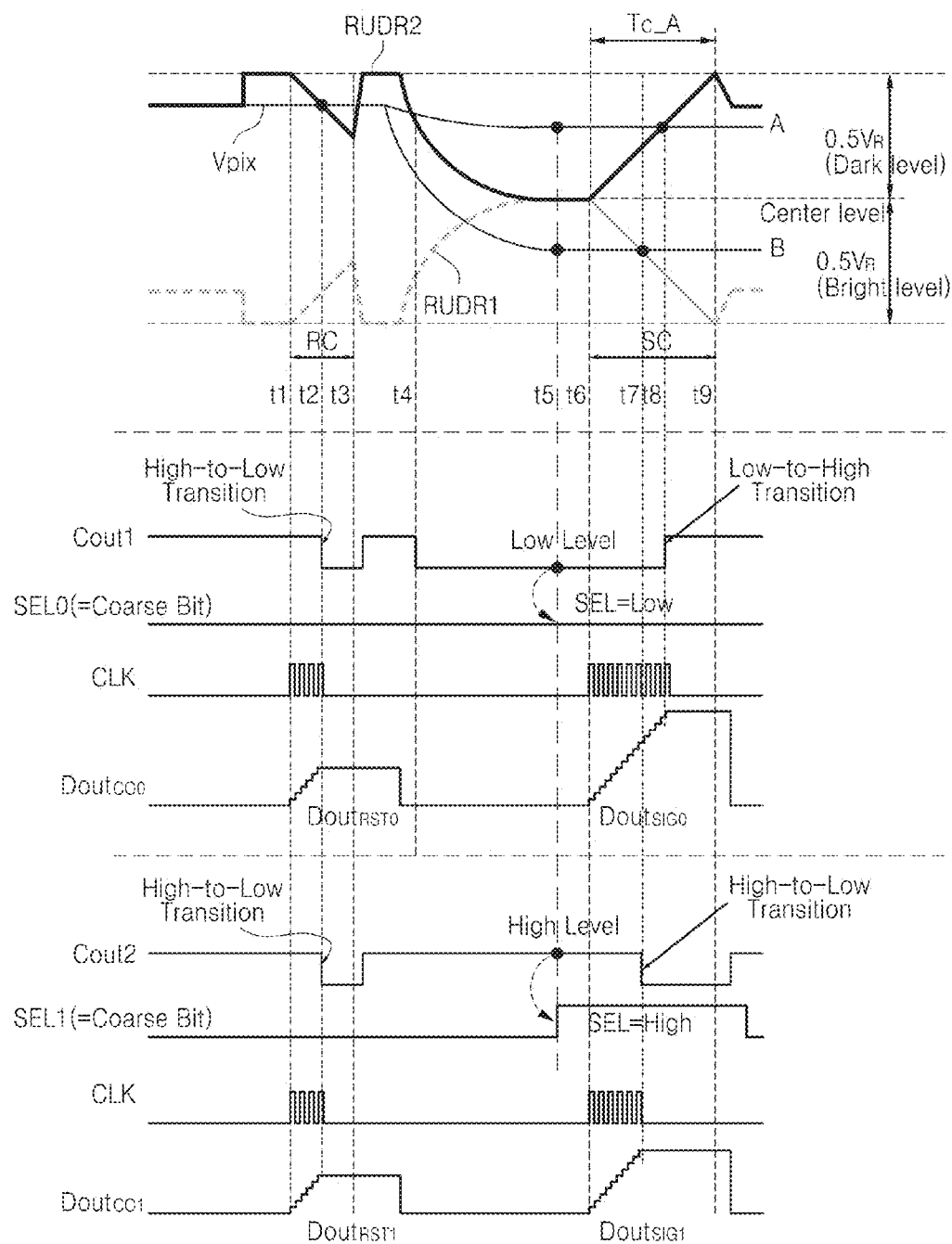
FIG. 8 is another example embodiment of the timing diagram for describing an operation of the example embodiment illustrated in FIG. 6.

FIGS. 7A and 7B are example embodiments of timing diagrams for describing an operation of signal processing circuit portion of 130-1A illustrated in FIG. 6. FIG. 7A is a timing diagram for describing an operation of signal processing circuit portion 130-1A when the ramping up/down signal is in a "/" shape or a "\" shape, and FIG. 7B is a timing diagram for describing an operation of signal processing circuit portion 130-1A when the ramping up/down signal is in a "∧" shape or a "∨" shape. FIGS. 7A and 7B illustrate a conversion interval TC_A. Here, as can be seen in FIG. 8, the conversion interval TC_A is the same as the image interval SC.

In FIG. 7A, it is assumed that the second ramping up/down signal RUDR2 is output from first selector 221 as an output ramping up/down signal ORDU1 at the beginning of the time period illustrated. Here, the level of output ramping up/down signal ORUD1 is greater than the level of the pixel signal Vpix at first time t1, and as a result the first comparator 151 outputs a comparison signal Cout having a value of "1" to memory 171. That is, first selector 221 keeps outputting the second ramping up/down signal RUDR2 as the output ramping up/down signal during the conversion interval TC_A.

When comparing FIG. 4A with FIG. 7A, first selector 221 outputs the second ramping up/down signal RUDR2 during a conversion interval TC_A, so that VR is reduced to 0.5 VR. Accordingly, the conversion interval TC_A in FIG. 7A becomes a half of the conversion interval TC in FIG. 4A.

First comparator 151 compares: (1) a correlated double sampled output signal CDSout, produced by comparing the output ramping up/down signal ORUD1, correlated double sampled by capacitor C2, with the pixel signal Vpix, correlated double sampled by capacitor C1; with (2) the reference signal Vref, at the first time t1, and outputs the comparison signal Cout for selecting the ramping up/down signal, and performs conversion in the conversion interval TC_A according to a result of the comparison.

In FIG. 7B, it is assumed that the second ramping up/down signal RUDR2 is output from first selector 221 as an output ramping up/down signal ORDU1 at the beginning of the time period illustrated. Here, the level of output ramping up/down signal ORUD1=RUDR2 is less than the level of the pixel signal Vpix at the first time t1, and as a result the first comparator 151 outputs a comparison signal Cout having a value of "0" to memory 171. That is, first selector 221 outputs the first ramping up/down signal RUDR1 as the output ramping up/down signal ORUD1 during the conversion interval TC_A.

When comparing FIG. 4B with FIG. 7B, first selector 221 outputs the first ramping up/down signal RUDR1 in conversion interval TC_A, so that VR is reduced to 0.5 VR. Accordingly, the conversion interval TC_A in FIG. 7B becomes a half of the conversion interval TC in FIG. 4B.

First comparator 151 compares: (1) the correlated double sampled output signal CDSout, produced by comparing the output ramping up/down signal ORUD1, correlated double sampled by capacitor C2, with the pixel signal Vpix, correlated double sampled by capacitor C1; with (2) the reference signal Vref at the first time t1, and outputs the comparison signal Cout for selecting the ramping up/down signal, and then performs conversion in the image interval SC according to a result of that comparison.

FIG. 8 is another example embodiment of a timing diagram for describing an operation of an signal processing circuit portion 130-1A illustrated in FIG. 6. Referring to FIGS. 6 and 8, in this example it is assumed that first selector 221 outputs the second ramping up/down signal RUDR2 to first CDS circuit 141 as the output ramping up/down signal ORUD1 in a reset interval RC, for example because the coarse bit output by memory 171 is a low level (e.g., logic "0").

Before the image interval SC, amplifier 147 of the first CDS circuit 141 compares the correlated double sampled output ramping up/down signal with the correlated double sampled pixel signal Vpix, and outputs an output signal according to a result of the comparison. First comparator 151 compares the output signal of first CDS circuit 141 with the reference signal Vref once, and outputs a one-bit coarse bit corresponding to a result of the comparison as a comparison signal Cout1.

In an interval t1 to t2 in which the level of the output ramping up/down signal ORUD1, correlated double sampled by capacitor C1, is greater than the level of the pixel signal Vpix, correlated double sampled by capacitor C2, the comparison signal Cout1 maintains a first level, e.g., a high level (e.g., "1").

First counter 161 in FIG. 5 counts a clock signal CLK from the first time t1 to the second time t2 when the level of the output ramping up/down signal ORUD1 equals Vpix, and outputs a counted value (Dout=DoutCO0=DoutRST0). The comparison signal Cout1 transitions from high to low at the second time t2.

When the reset interval RC is finished, the output ramping up/down signal ORUD1 is initialized to the first level the same as at the first time t1, and a comparison signal Cout1 is back to the high level. While the pixel signal Vpix is settled after the reset interval RC is finished, the output ramping up/down signal ORUD1 is settled to a central level.

Before the image interval SC, first CDS circuit 141 compares the correlated double sampled pixel signal Vpix with the correlated double sampled output ramping up/down signal ORUD1, and outputs the correlated double sampled output signal CDSout according to a result of the comparison at time t5 when the settling of the pixel signal Vpix is finished.

First comparator 151 compares the correlated double sampled output signal CDSout of first CDS circuit 141 with the reference signal Vref once and outputs to memory 171 the one-bit coarse bit corresponding to a result of the comparison as a comparison signal Cout1. Memory 171 in turns outputs the one-bit coarse bit to selector 221 as the selection signal SEL0 at time t5.

When the pixel signal Vpix is at the level "A" as shown in FIG. 8, the level of the correlated double sampled output ramping up/down signal ORUD1 is less than the level of the correlated double sampled pixel signal Vpix at the time t5, so that the comparison signal Cout1, and therefore the selection signal SEL0, is "0."

When the selection signal SEL0 is "0," first selector 221 outputs the first ramping up/down signal RUDR1 as the output ramping up/down signal ORUD1, and first CDS circuit 141 compares the correlated double sampled first ramping up/down signal RUDR1 with the correlated double sampled pixel signal Vpix belonging to a dark level region in the image interval SC, and outputs a result of the comparison as the correlated double sampled output signal CDSout. First comparator 151 compares the correlated double sampled output signal CDSout with the reference signal Vref and outputs the comparison signal Cout1.

In a interval t6 to t8 in which the level of the correlated double sampled output ramping up/down signal ORUD1 is less than the level of the correlated double sampled pixel signal Vpix, the comparison signal Cout1 maintains a low level. At time t8 when the level of the correlated double sampled output ramping up/down signal ORUD1 is greater than the level of the correlated double sampled pixel signal Vpix, the comparison signal Cout1 transitions from low to high.

The first counter 161 counts a clock signal CLK in the interval t6 to t8 based on a level transition of the comparison signal Cout1 and outputs a counted value Dout=DoutCO0=DoutSIG0. The counted value DoutCO0 corresponds to the sum of: (1) a value calculated by subtracting the counted value DoutRST0 in the reset interval RC from the counted value DoutSIG0 in the image interval SC; and (2) a digital offset. The digital offset denotes a digital offset generated when the comparison operation is performed at the central level of ramping up/down signal ORUD1.

When the pixel signal Vpix is at the "B" level as shown in FIG. 8, the level of the correlated double sampled output ramping up/down signal ORUD1 is greater than the level of the correlated double sampled pixel signal Vpix, so that a comparison signal Cout2, and therefore the selection signal SEL1, is "1".

Accordingly, when the selection signal SEL1 is "1", first selector 221 outputs the second ramping up/down signal RUDR2 as the output ramping up/down signal ORUD1, and first CDS circuit 141 compares in the image interval SC the correlated double sampled second ramping up/down signal RUDR2 with a correlated double sampled pixel signal Vpix belonging to a bright level region and outputs a result of the comparison as the correlated double sampled CDSout.

First comparator 151 compares the correlated double sampled output signal CDSout with the reference signal Vref, and outputs a comparison signal Cout2.

In the interval t6 to t8 in which the level of the correlated double sampled output ramping up/down signal ORUD1 is greater than the level of the correlated double sampled pixel signal Vpix, the comparison signal Cout2 maintains a high level. At seventh time t7 when the level of the correlated double sampled output ramping up/down signal ORUD1 is less than the level of the correlated double sampled pixel signal Vpix, the comparison signal Cout2 transitions from high to low.

First counter 161 counts a clock signal CLK in an interval t6 to t7 based on a level transition of the comparison signal Cout2, and outputs a counted value Dout=DoutCO1=DoutSIG1. The counted value DoutCO1 corresponds to the sum of: (1) a value calculated by subtracting a counted value DoutRST1 in the reset interval RC from a counted value DoutSIG1 in the image interval SC; and (2) a digital offset. The digital offset denotes a digital offset generated when a comparison operation is performed at the center level of ramping up/down signal ORUD1.

When the pixel signal Vpix of FIG. 8 is at the "B" level, selector 221 outputs the second ramping up/down signal RUDR2 in both the reset interval RC and the image interval SC, so that an output signal Cout=Cout2 of first comparator 151 transitions from high to low in both intervals RC and SC. Therefore, a delay of first CDS circuit 141 and a delay of first comparator 151 are offset by each other, and thereby an accurate result may be obtained.

When the pixel signal Vpix of FIG. 8 is at the "A" level, selector 221 outputs the second ramping up/down signal RUDR2 in the reset interval RC, and outputs the first ramping up/down signal RUDR1 in the image interval SC. Accordingly, the output signal Cout1 of first comparator 151 transitions from high to low in the reset interval RC, and transitions from low to high in the image interval SC. Therefore, a delay of first CDS circuit 141 and a delay of first comparator 151 are different from each other, and it is possible that the accuracy of the digital signal Dout may be degraded.

Figure 9:
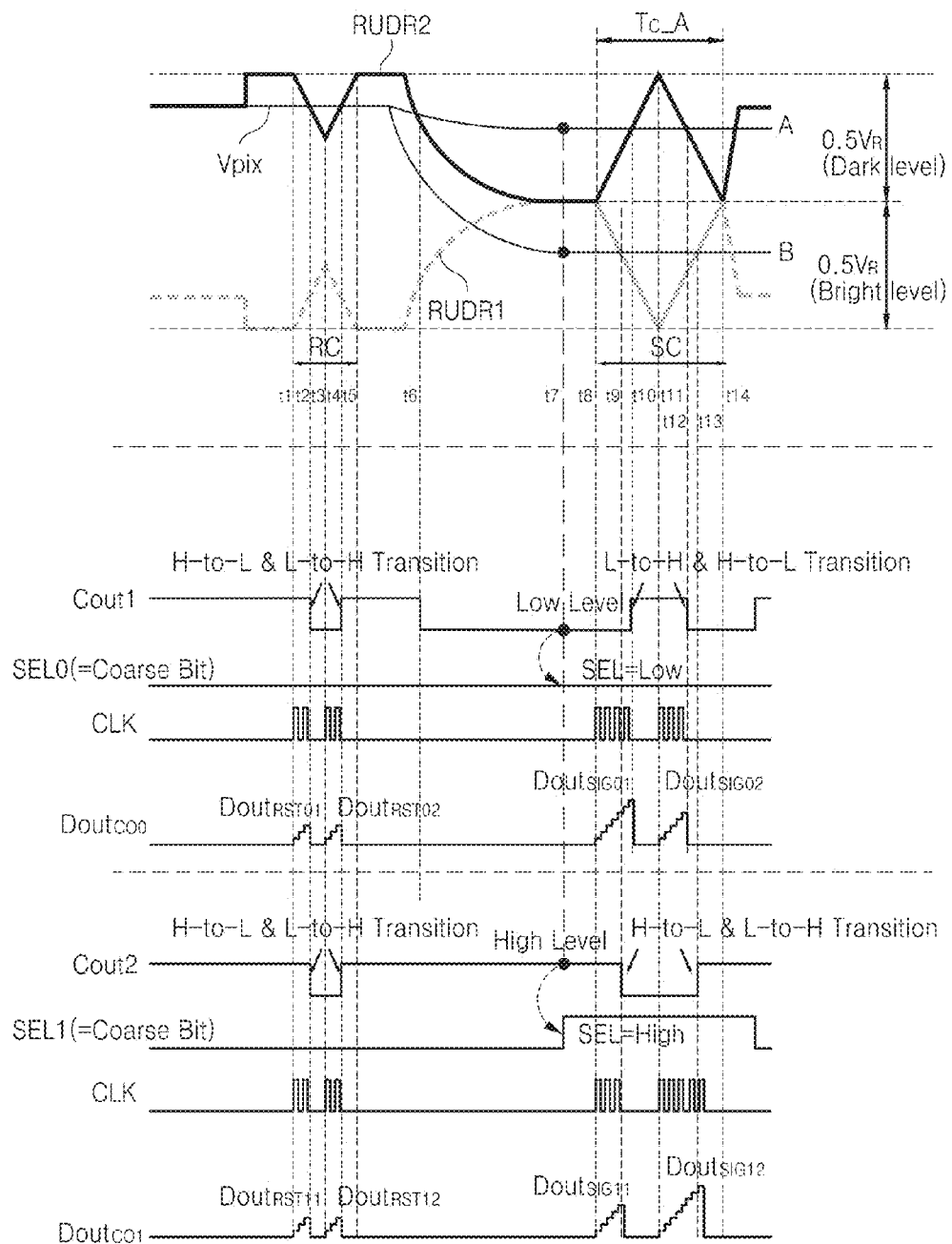
FIG. 9 is another example embodiment of the timing diagram for describing an operation of the example embodiment illustrated in FIG. 6.

FIG. 9 is another example embodiment of the timing diagram for describing an operation of the example embodiment illustrated in FIG. 6. FIG. 9 is an example embodiment where a multiple-sampling (MS) method (hereinafter, referred to as MS method) is applied. In the MS method, the ramping up/down signal has an up operation and a down operation each for once in the reset interval RC and in the image interval SC.

Referring to FIGS. 6 and 9, it is assumed that first selector 221 outputs the second ramping up/down signal RUDR2 to first CDS circuit 141 as the output ramping up/down signal ORUD1 in the reset interval RC. In an interval t1 to t2 where the level of the correlated double sampled output ramping up/down signal ORUD1 is greater than the level of the correlated double sampled pixel signal Vpix, the comparison signal Cout1 maintains a high level, and at second time t2 when the level of the correlated double sampled output ramping up/down signal ORUD1 is less than the level of the correlated double sampled pixel signal Vpix, the comparison signal Cout1 transitions from high to low.

The comparison signal Cout1 maintains a low level, and at time t4 where the level of the correlated double sampled output ramping up/down signal ORUD1 is greater than the level of the correlated double sampled pixel signal Vpix, the comparison signal Cout1 transitions from low to high.

First counter 161 performs a count operation in the interval t1 to t2 where a first transition of the comparison signal Cout1 occurs in the reset interval RC, and performs the count operation from time t3 when a direction of the ramping up/down signal is changed to time t4 when a second transition of the comparison signal Cout1 occurs. When the reset interval RC is over, the output ramping up/down signal ORUD1 is initiated to a first level the same as at the first time t1, and an output Cout1 of first comparator 151 is back to the high level.

During the settling of the pixel signal Vpix after the reset interval RC is over, the output ramping up/down signal ORUD1 is settled to a central level. While the settling of the pixel signal Vpix is performed, settling of the first ramping up/down signal may be simultaneously performed.

Before the image interval SC, first CDS circuit 141 compares a correlated double sampled pixel signal with a correlated double sampled output ramping up/down signal and outputs the correlated double sampled output signal CDSout according to a result of the comparison at time t7 when the settling of the pixel signal Vpix is over. The first comparator 151 compares the correlated double sampled output signal CDSout of first CDS circuit 141 with the reference signal Vref once, and outputs a one-bit coarse bit corresponding to a result of the comparison as a comparison signal Cout1.

When the pixel signal Vpix is at the "B" level as shown in FIG. 9, the level of the correlated double sampled output ramping up/down signal ORUD1 is less than the level of the correlated double sampled pixel signal Vpix at the time t7, so that the comparison signal Cout1, and therefore the selection signal SEL0, is "0". When the selection signal SEL0 is "0", first selector 221 outputs the first ramping up/down signal RUDR1 as the output ramping up/down signal ORUD1.

First CDS circuit 141 compares the correlated double sampled output ramping up/down signal RUDR1 with the correlated double sampled pixel signal in the image interval SC, and outputs a result of the comparison as the correlated double sampled output signal CDSout. First comparator 151 compares the correlated double sampled output signal CDSout with the reference signal Vref and outputs the comparison signal Cout1.

In a interval t8 to t10 where the level of the correlated double sampled output ramping up/down signal ORUD1 is less than the level of the correlated double sampled pixel signal Vpix, the comparison signal Cout1 maintains a low level, and the comparison signal Cout1 at time t10 transitions from low to high. In an interval t10 to t12 where the level of the correlated double sampled output ramping up/down signal ORUD1 is greater than the level of the correlated double sampled pixel signal Vpix, the comparison signal Cout1 maintains a high level, and at time t12 when the level of the correlated double sampled output ramping up/down signal ORUD1 is greater than the level of the correlated double sampled pixel signal Vpix, the comparison signal Cout1 transitions from high to low.

First counter 161 performs a count operation from the time t8 to the time t10 when a first transition occurs, and performs a count operation from time t11 when a direction of the ramping up/down signal is changed to time t12 when a second transition occurs.

When the pixel signal Vpix is at the "B" level as shown in FIG. 9, the level of the correlated double sampled output ramping up/down signal ORUD1 is greater than the level of the correlated double sampled pixel signal Vpix at the time t7, so that the comparison signal Cout2, and therefore the selection signal SEL1, is "1."

When the selection signal SEL1 is "1", first selector 221 outputs the second ramping up/down signal RUDR2 as the output ramping up/down signal ORUD1.

First CDS circuit 141 compares a correlated double sampled output ramping up/down signal with a correlated double sampled pixel signal, and outputs a result of the comparison as the correlated double sampled output signal CDSout in the image interval SC. First comparator 151 compares the correlated double sampled output signal CDSout with the reference signal Vref and outputs a comparison signal Cout2.

In an interval t8 to t9 where the level of the correlated double sampled output ramping up/down signal ORUD1 is greater than the level of the correlated double sample pixel signal Vpix, the comparison signal Cout2 maintains a high level, and the comparison signal Cout2 transitions from high to low at time t9 when the level of the correlated double sampled output ramping up/down signal ORUD1 is less than the level of the correlated double sampled pixel signal.

In an interval t9 to t13 where the level of the correlated double sampled output ramping up/down signal ORUD1 is less than the level of the correlated double sampled pixel signal Vpix, the comparison signal Cout2 maintains a low level. At time t13 when the level of the correlated double sample output ramping up/down signal is greater than the level of the correlated double sampled pixel signal Vpix, the comparison signal Cout2 transitions from high to low.

First counter 161 performs a count operation from the time t8 to the time t9 when a first transition occurs, and performs a count operation from time t11 when a direction of the ramping up/down signal is changed to time t13 when a second transition occurs.

An output signal DoutCO0 of first counter 161, i.e., each count value DoutRST01, DoutRST02, DoutSIG01, and DoutSIG02, may be calculated based on the comparison signal Cout1 and a clock signal CLK. In addition, an output signal DoutCO1 of first counter 161, i.e., each count value DoutRST01, DoutRST02, DoutSIG11, and DoutSIG12, may be calculated based on the comparison signal Cout2 and the clock signal CLK.

Output signal DoutCO0 and/or DoutCO1 of first counter 161 may include a digital offset occurring when performing a comparison operation to compare between central levels.

FIG. 10 is another example embodiment of a circuit diagram for a portion 130-1B of the signal processing circuit illustrated in FIG. 5. FIG. 10 illustrates a case where the number of coarse bits of a portion of the signal processing circuit illustrated in FIG. 5 is extended to two bits. According to an example embodiment, the coarse bit may be extended to three bits or more.

Referring to FIGS. 6 and 10, the signal generator 210 according to another example embodiment signal processing circuit portion 130-1B of the signal processing circuit illustrated in FIG. 5 includes two groups of unit signal generators 211 and 231. Although not shown in FIG. 10, besides the structure of signal generator 210 and selector 221, signal processing circuit portion 130-1B may include the remainder of the elements shown in FIG. 6 (e.g., elements 141, 151 and 171), connected in the same configuration as shown in FIG. 6.

A structure and an operation of a first group of unit signal generator 211 are substantially the same as a structure and an operation of the signal generator 210 of FIG. 6. A structure and an operation of each of two groups of unit signal generators 211 and 231 are substantially the same as each other.

Signal generator 210 generates a first ramping up/down signal RUDR1, a second ramping up/down signal RUDR2, a third ramping up/down signal RUDR3, and a fourth ramping up/down signal RUDR4 in response to control bits output from timing generator 180.

As illustrated in FIG. 10, the first ramping up/down signal RUDR1 has a waveform in a "Λ" or a "/" shape, and the second ramping up/down signal RUDR2 has a waveform in a "V" or a "\" shape. Moreover, the third ramping up/down signal RUDR3 has a waveform in a "Λ" or a "/" shape, and the fourth ramping up/down signal RUDR4 has a waveform in a "V" or a "\" shape.

Here, the first ramping up/down signal RUDR1 and the second ramping up/down signal RUDR2 may be complementary signals or differential signals. The third ramping up/down signal RUDR3 and the fourth ramping up/down signal RUDR4 may be complementary signals or differential signals.

According to an example embodiment, the first ramping up/down signal RUDR1 and the third ramping up/down signal RUDR3 may be the same signals or different signals. The second ramping up/down signal RUDR2 and the fourth ramping up/down signal RUDR4 may be the same signals or different signals.

First selector 221 may output the first ramping up/down signal RUDR1, the second ramping up/down signal RUDR2, the third ramping up/down signal RUDR3, and the fourth ramping up/down signal RUDR4 as the output ramping up/down signal ORUD1 in response to a selection signal SEL having a plurality of bits.

For example, when a two-bit selection signal SEL is "00," first selector 221 may output the first ramping up/down signal RUDR1, and when the selection signal SEL is "11", first selector 221 may output the fourth ramping up/down signal RUDR4. In addition, when the two-bit selection signal SEL is "01," first selector 221 may output the second ramping up/down signal RUDR2, and when the selection signal SEL is "10," the first selector 221 may output the third ramping up/down signal RUDR3.

The two-bit coarse bit may be stored in the first memory 171 as selection signal(s) SEL, and simultaneously may be output to counter 161.

Figure 11:
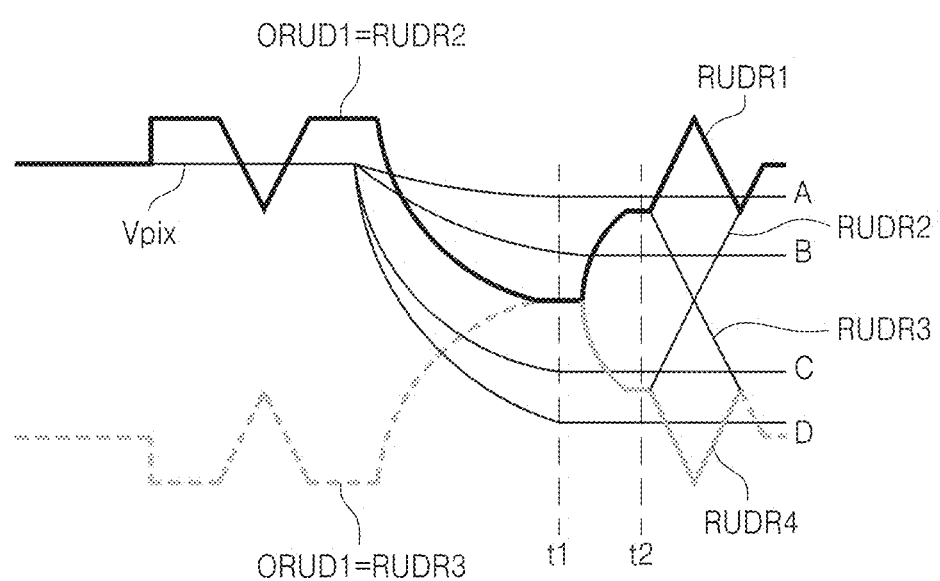
FIG. 11 is an example embodiment of a timing diagram for describing an operation of the portion of the signal processing circuit illustrated in FIG. 10.

FIG. 11 is an example embodiment of a timing diagram for describing an operation of signal processing circuit portion 130-1B. First comparator 151 may perform a comparison operation M (M is a natural number) times before the image interval, and output a comparison signal Cout.

A case where M is 2 will be described referring to FIGS. 10 to 13. Before the image interval SC, at each of the first time t1 and the second time t2, amplifier 147 of first CDS circuit 141 compares a correlated double sampled output ramping up/down signal with a correlated double sampled pixel signal Vpix, and outputs the correlated double sampled output signal CDSout according to a result of the comparison.

First comparator 151 compares the correlated double sampled output signal CDSout of the first CDS circuit 141 with the reference signal Vref twice, and outputs a two-bit coarse bit corresponding to results of the comparison as the comparison signal Cout at the first time t1 and the second time t2.

First selector 221 may output the first ramping up/down signal RUDR1, the second ramping up/down signal RUDR2, the third ramping up/down signal RUDR3, and the fourth ramping up/down signal RUDR4 according to values stored in first memory 171. The two-bit coarse bit may be stored in first memory 171 as a selection signal SEL, and simultaneously may be output to first counter 161.

Figure 12:
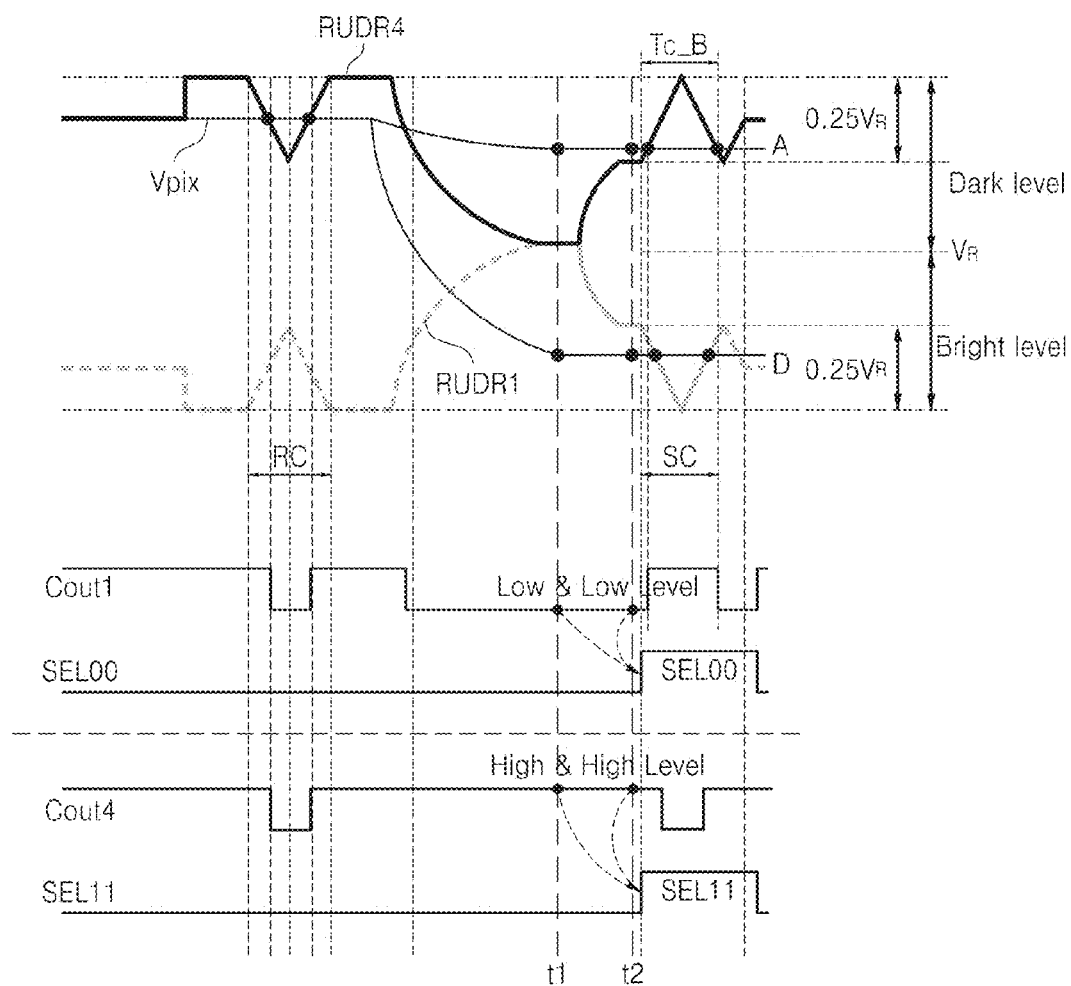
FIG. 12 is another example embodiment of the timing diagram for the portion of the signal processing circuit illustrated in FIG. 10.

FIG. 12 is another example embodiment of a timing diagram for signal processing circuit portion 130-1B. In FIG. 12, a ramping up/down signal in the MS method, and output signals Cout1 and Cout2 and selection signals SEL00 and SEL11 of first comparator 151 are illustrated.

In the reset interval RC, it is assumed that first selector 221 outputs the fourth ramping up/down signal RUDR4 as the output ramping up/down signal ORUD1. Before the image interval SC, amplifier 147 of first CDS circuit 141 compares the correlated double sampled ramping up/down signal with the correlated double sampled pixel signal, and outputs the correlated double sampled output signal CDSout according to a result of the comparison.

First comparator 151 compares the correlated double sampled output signal CDSout of the first CDS circuit 141 with the reference signal Vref once and outputs a comparison signal Cout1 corresponding to a result of the comparison.

When a first coarse bit is "0," the level of a pixel signal Vpix is in a dark level range, and thus the output ramping up/down signal ORUD1 is settled to be the ¾ level of VR. When the first coarse bit is "1," the level of the pixel signal Vpix is in a bright level range, and thus the output ramping up/down signal ORUD1 is settled to ¼ level of VR.

According to a result of the first coarse bit, when the settling of the output ramping up/down signal ORUD1 is finished, first CDS circuit 141 compares the correlated double sampled pixel signal Vpix with the correlated double sampled output ramping up/down signal ORUD1 again, and outputs a result of the comparison as the correlated double sampled output signal CDSout, and first comparator 151 compares the correlated double sampled output signal CDSout of the first CDS circuit with the reference signal Vref once and stores a result of the comparison Cout1 in memory 171.

When the pixel signal Vpix is at the "A" level as shown in FIG. 12, since the level of the correlated double sampled output ramping up/down signal ORUD1 is less than the level of the correlated double sampled pixel signal Vpix at the first time t1, the comparison signal Cout1, i.e., a selection signal SEL, is "0." When the election signal SEL is "0," first selector 221 selects the first ramping up/down signal RUDR1 settled at the ¾ level of VR as the output ramping up/down signal ORUD1.

Since the level of the output ramping up/down signal ORUD1 is less than the level of the pixel signal at the second time t2, the selection signal SEL is determined to be "00." That is, first selector 221 finally selects the first ramping up/down signal RUDR1 as the output ramping up/down signal ORUD1 during the conversion interval Tc_B.

First CDS circuit 141 compares the correlated double sampled output ramping up/down signal with the correlated double sampled pixel signal and outputs a result of the comparison as the correlated double sampled output signal CDSout in the image interval SC. First comparator 151 compares the correlated double sampled output signal CDSout with the reference signal Vref and outputs a comparison signal Cout1.

When the pixel signal Vpix is at the "D" level as shown in FIG. 12, since the level of the correlated double sampled output ramping up/down signal ORUD1 is greater than the level of the correlated double sampled pixel signal Vpix at the first time t1, the comparison signal Cout4, i.e., a selection signal SEL, is "1." When the selection signal SEL is "1," the first selector 221 selects the fourth ramping up/down signal RUDR4 settled at the ¼ level of VR as the output ramping up/down signal ORUD1.

Since the level of the output ramping up/down signal ORUD1 is greater than the level of the pixel signal at the second time t2, the selection signal SEL is determined to be "11." That is, first selector 221 finally selects the fourth ramping up/down signal RUDR4 as the output ramping up/down signal ORUD1 during the conversion interval Tc_B.

First CDS circuit 141 compares the correlated double sampled output ramping up/down signal with the correlated double sampled pixel signal and outputs a result of the comparison as the correlated double sampled output signal CDSout in the image interval SC. First comparator 151 compares the correlated double sampled output signal CDSout with the reference signal Vref and outputs a comparison signal Cout4.

Figure 4:
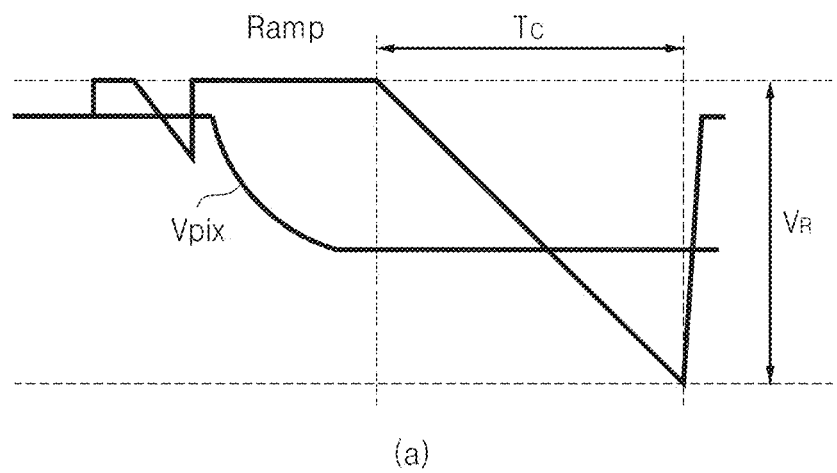
FIGS. 4A and 4B are timing diagrams for describing an operation of the conventional signal processing circuit illustrated in FIG. 3.
Figure 4:
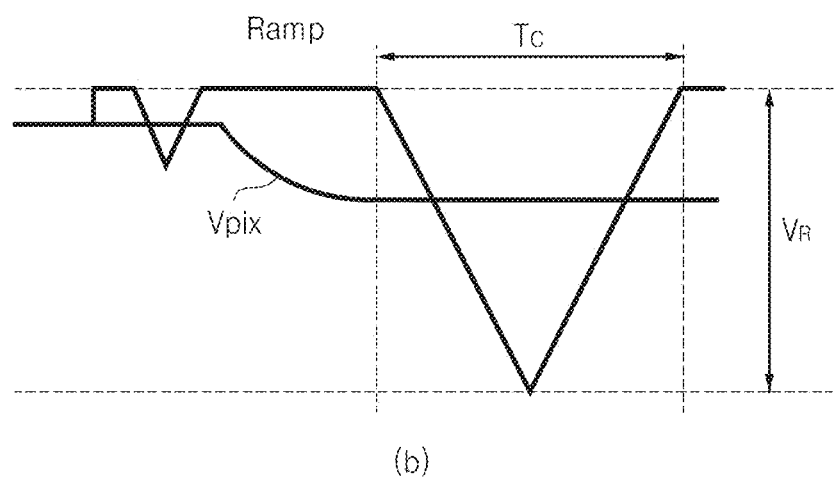

Referring to FIGS. 4 and 12, a conversion interval Tc_B of FIG. 12 is reduced to the ¼ of the conversion interval TC of FIG. 4, and VR of FIG. 12 is reduced to the ¼ of VR of FIG. 4. Accordingly, analog-to-digital conversion speed may be improved.

Figure 13:
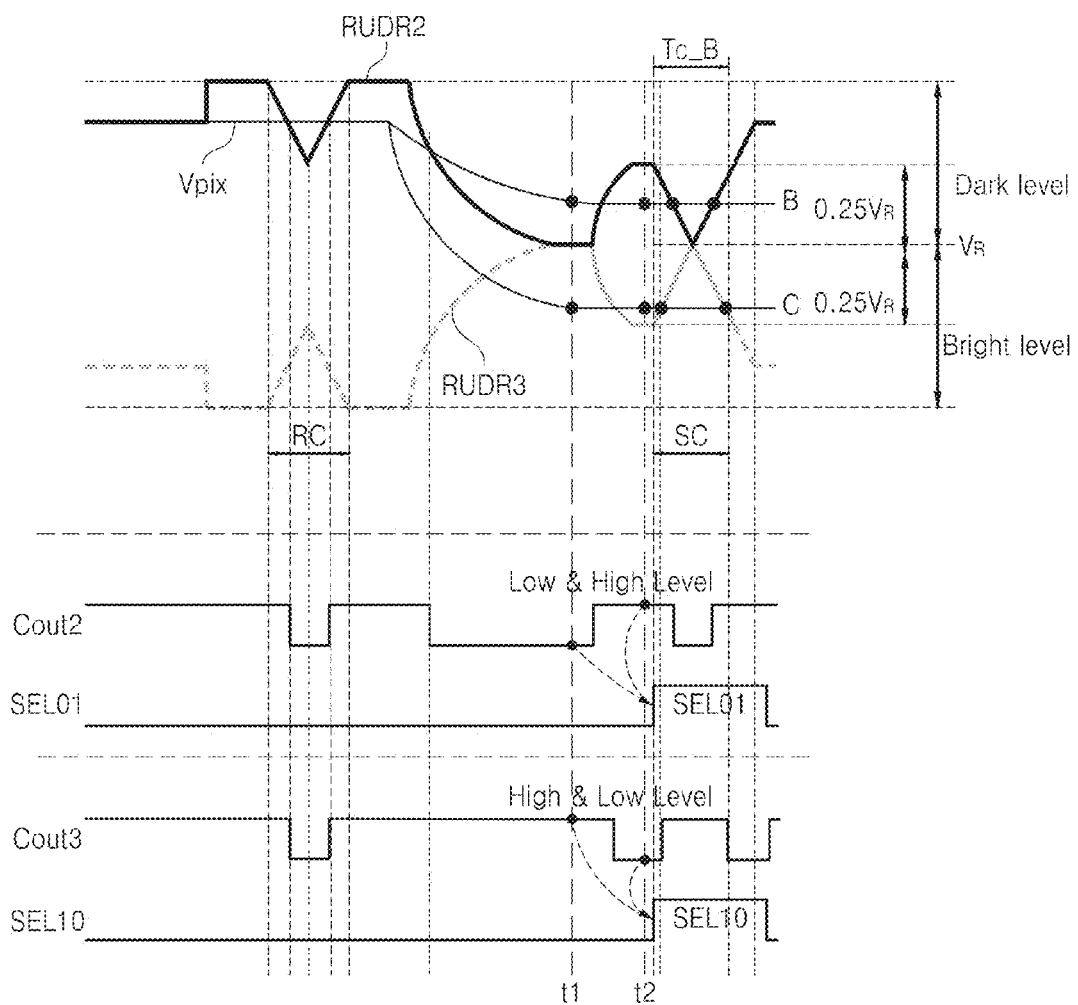
FIG. 13 is still another example embodiment of the timing diagram for the portion of the signal processing circuit illustrated in FIG. 10.

FIG. 13 is still another example embodiment of a timing diagram for signal processing circuit portion 130-1B. In FIG. 13, a ramping up/down signal in the MS method, output signals Cout2 and Cout3 and selection signals SEL01 and SEL10 of first comparator 151 are illustrated.

In the reset interval RC, it is assumed that first selector 221 outputs the second ramping up/down signal RUDR2 as the output ramping up/down signal ORUD1. Before the image interval SC, amplifier 147 of first CDS circuit 141 compares the correlated double sampled output ramping up/down signal with the correlate double sampled pixel signal and outputs the correlated double sampled output signal CDSout according to a result of the comparison.

First comparator 151 compares the correlated double sampled output signal CDSout of first CDS circuit 141 with the reference signal Vref once, and outputs a comparison signal Cout2 corresponding to a result of the comparison.

When the first coarse bit is "0," the level of the pixel signal Vpix is in the range of dark level, and thus the output ramping up/down signal ORUD1 is settled to the ¾ level of the VR. When the first coarse bit is "1," the level of the pixel signal is in a range of bright level, and thus the output ramping up/down signal ORUD1 is settled to the ¼ level of the VR.

When the settling of the output ramping up/down signal ORUD1 is finished according to a result of the first coarse bit, first CDS circuit 141 compares the correlated double sampled pixel signal with the correlated double sampled output ramping up/down signal ORUD1 again and outputs a result of the comparison as the correlated double sampled output signal CDSout, and first comparator 151 compares the correlated double sampled output signal CDSout of first CDS circuit 141 with the reference signal Vref once, and stores a result of the comparison Cout in memory 171.

When the pixel signal is at the "B" level as shown in FIG. 13, the level of the correlated double sampled output ramping up/down signal ORUD1 is less than the level of the correlated double sampled pixel signal Vpix at the first time t1, and thus the comparison signal Cout2, i.e., the selection signal SEL, is "0." When the selection signal SEL is "0," first selector 221 selects the first ramping up/down signal RUDR2 settled to the ¾ level of the VR as the output ramping up/down signal.

At the second time t2, since the level of the output ramping up/down signal ORUD1 is greater than the level of the pixel signal, the selection signal SEL is determined to be "01." That is, first selector 221 finally outputs the second ramping up/down signal RUDR2 as the output ramping up/down signal ORUD1 during the conversion interval Tc_B.

First CDS circuit 141 compares the correlated double sampled output ramping up/down signal with the correlated double sampled pixel signal and outputs a result of the comparison as the correlated double sampled output signal CDSout in the image interval SC. First comparator 151 compares the correlated double sampled output signal CDSout with the reference signal Vref and outputs the comparison signal Cout2.

When the pixel signal Vpix is at the "C" level as shown in FIG. 13, since the level of the output ramping up/down signal ORUD1 is greater than the level of the pixel signal Vpix, a comparison signal Cout3, i.e., the selection signal SEL, is "1." When the selection signal SEL is "1," first selector 221 outputs the third ramping up/down signal RUDR3 settled to the ¼ level of the VR as the output ramping up/down signal.

Since the level of the output ramping up/down signal ORUD1 is less than the level of the pixel signal at the second time t2, the selection signal SEL is determined to be "10." That is, first selector 221 finally outputs the third ramping up/down signal RUDR3 as the output ramping up/down signal ORUD1 during the conversion interval Tc_B. First CDS circuit 141 compares the correlate double sampled output ramping up/down signal with the correlated double sampled pixel signal and outputs a result of the comparison as the correlated double sampled output signal CDSout in the image interval SC. First comparator 151 compares the correlated double sampled output signal CDSout with the reference signal Vref and outputs the comparison signal Cout3.

Referring to FIGS. 4 and 13, a conversion interval Tc_B of FIG. 13 is reduced to the ¼ of the conversion interval TC of FIG. 4, and VR of the FIG. 13 is reduced to the ¼ of the VR of FIG. 4. Accordingly, the analog-to-digital conversion speed may be improved.

Figure 14:
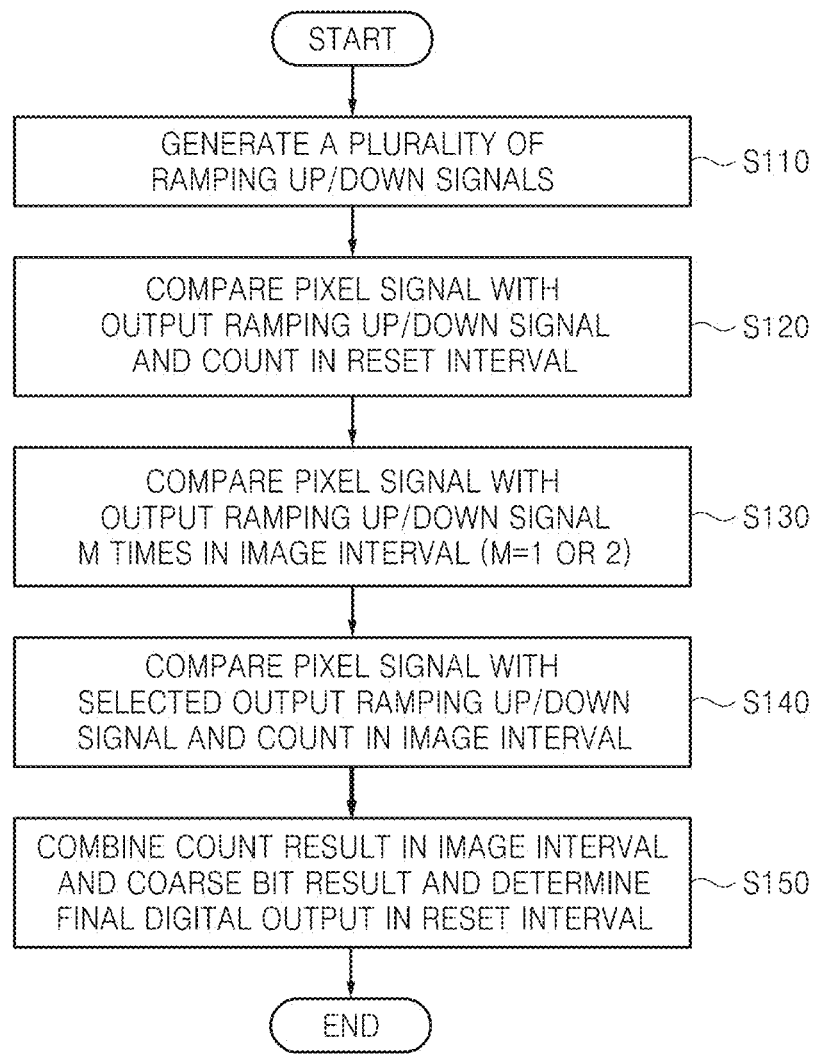
FIG. 14 is a flowchart depicting a method of operating a CMOS image sensor according to an example embodiment of the present inventive concepts.

FIG. 14 is a flowchart depicting a method of operating a CMOS image sensor according to an example embodiment of the present inventive concepts. Referring to FIGS. 1 to 13, signal generator 210 generates a plurality of ramping up/down signals, and first selector 221 outputs one of the plurality of ramping up/down signals as the output ramping up/down signal in response to the selection signal SEL (S110).

First CDS circuit 141 compares the correlated double sampled pixel signal with the correlated double sampled ramping up/down signal and outputs the correlated double sampled output signal CDSout in the reset interval RC, first comparator 151 compares the correlated double sampled output signal CDSout of first CDS circuit 141 with the reference signal Vref and outputs a comparison signal Cout, and first counter 161 counts time required for a transition of the comparison signal Cout based on a clock signal CLK (S120).

First CDS circuit 141 compares the correlated double sampled pixel signal with the correlated double sampled output ramping up/down signal once or more after the reset interval RC and before the image interval SC (S130).

First CDS circuit 141 compares the correlated double sampled pixel signal Vpix with the correlated double sampled ramping up/down signal and outputs the correlated double sampled output signal CDSout in the image interval SC, first comparator 151 compares the correlated double sampled output signal CDSout of first CDS circuit 141 with the reference signal Vref and outputs a comparison signal Cout, and first counter 161 counts a time required for a transition of the comparison signal Cout based on a clock signal CLK (S140).

Signal processing circuit 130 combines a count value counted in each of the reset interval RC and the image interval SC and a coarse bit result, thereby outputting a final digital output (S150).

Figure 15:
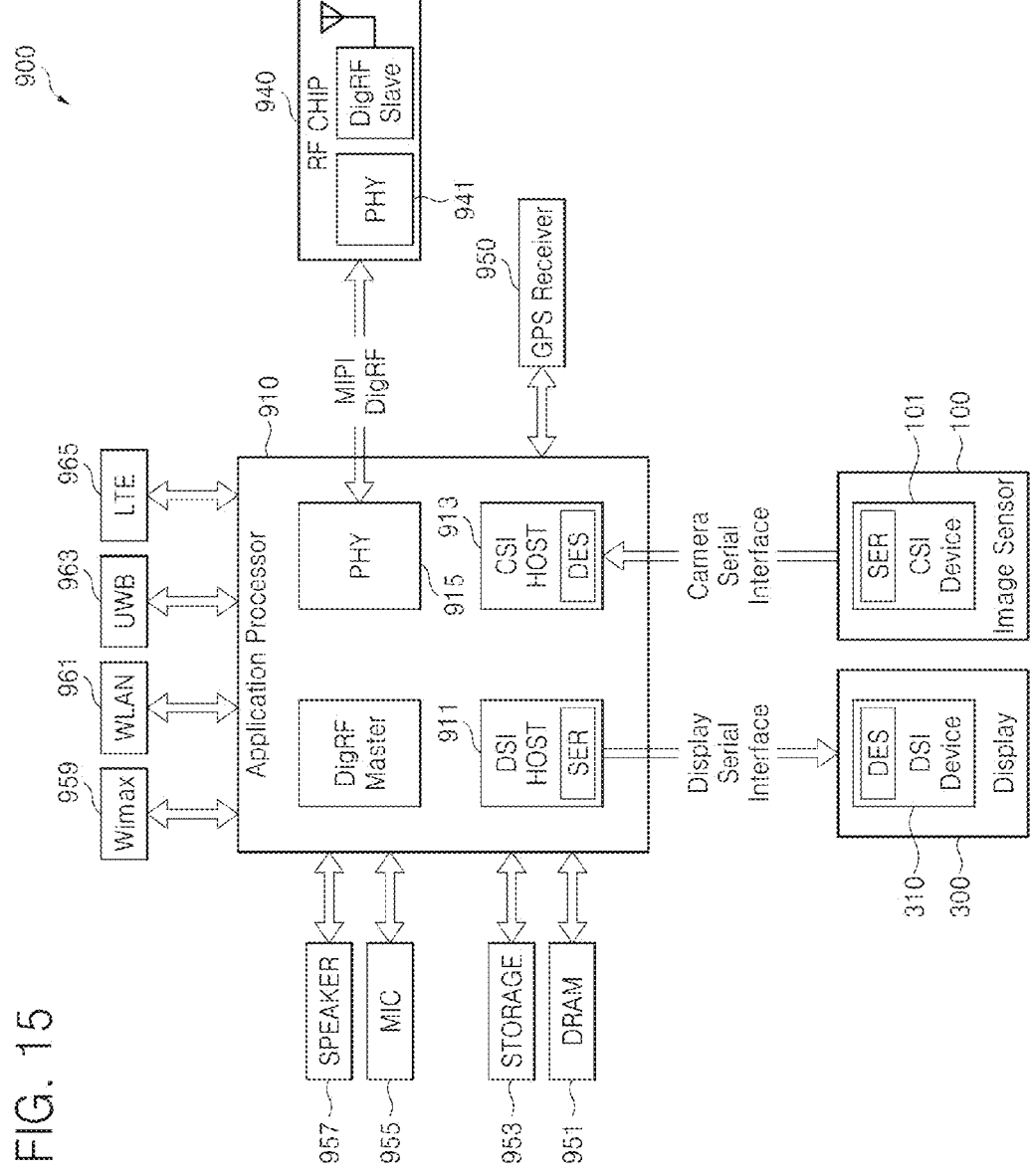
FIG. 15 is a block diagram of an image processing device including a CMOS image sensor structure illustrated in FIG. 1.

FIG. 15 is a block diagram of an image processing device 900 including a CMOS image sensor 100 having a structure as illustrated in FIG. 1.

Image processing device 900 may be embodied in a portable electronic device which may use or support a mobile industry processor interface (MIPI®). The portable electronic device may be embodied in a laptop computer, a personal digital assistant (PDA), a portable media player (PMP), a mobile phone, a smart phone, a tablet personal computer (PC), a digital camera, or a mobile internet device (MID).

Image processing device 900 includes an application processor (AP) 910, CMOS image sensor 100, and display 300. A camera serial interface (CSI) host 913 embodied in the AP 910 may perform a serial communication with a CSI device 101 of CMOS image sensor 100.

According to an example embodiment, a deserializer (DES) may be embodied in CSI host 913, and a serializer (SER) may be embodied in CSI device 101. A display serial interface (DSI) host 911 embodied in AP 910 may perform a serial communication with a DSI device 310 of display 300 through a display serial interface.

According to an example embodiment, the serializer (SER) may be embodied in DSI host 911, and the deserializer (DES) may be embodied in DSI device 310. The deserializer DES and the serializer SER may process an electrical signal or an optical signal, respectively.

Image processing device 900 may further include a radio frequency (RF) chip 940 which may communicate with AP 910. In some embodiments, physical layer 915 of AP 910 may transmit or receive data to/from a physical layer PHY 941 of the RF chip 940 according to MIPI DigRF. Image processing device 900 may further include a memory 951 such as a dynamic random access memory (DRAM), a data storage device 963 embodied in a non-volatile memory such as a NAND flash memory, a microphone 955, and a speaker 957.

Image processing device 900 may communicate with an external device using at least one communication protocol or communication standard, e.g., a worldwide interoperability for microwave access (WiMAX) 959, a Wireless LAN (WLAN) 961, an ultra-wideband (UWB) 963, or a long term evolution (LTE) 965. Image processing device 900 may communicate with an external device using Bluetooth or WiFi.

An image sensor according to embodiments of the inventive concepts may perform a correlated double sampling by applying two-step structure and a differential multi ramping up/down signal, and reduce entire time for analog-to-digital conversion according to a result of the performance.

Accordingly, the image sensor may perform a fast operation.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A method of operating an image sensor comprising a plurality of pixels, the method comprising:
   generating a plurality of ramping up/down signals;
   first comparing a correlated double sampled pixel signal produced from an output of a pixel with a correlated double sampled first ramping up/down signal among the plurality of ramping up/down signals in a reset interval;
   second comparing the correlated double sampled pixel signal with the correlated double sampled first ramping up/down signal at one or more sampling times after the reset interval and before an image interval; and
   selecting and outputting a selected ramping up/down signal among the plurality of ramping up/down signals in the image interval based on a result of the second comparing.

2. The method of claim 1, wherein the selected ramping up/down signal is a second ramping up/down signal which is different from the first ramping up/down signal.

3. The method of claim 1, wherein the selected ramping up/down signal is the first ramping up/down signal.

4. The method of claim 1, wherein at least two signals among the plurality of ramping up/down signals are differential signals.

5. The method of claim 4, wherein each pair of differential ramping up/down signals among the plurality of ramping up/down signals is generated by a different signal generator.

6. A device comprising an image sensor, wherein the image sensor comprises:

a pixel configured to generate a pixel signal; and a signal processing circuit configured to perform a first correlated double sampling (CDS) operation on the pixel signal by using a first ramping up/down signal among a plurality of ramping up/down signals in a reset interval, and to perform a second CDS operation on the pixel signal by using a selected ramping up/down signal among the plurality of ramping up/down signals in an image interval, wherein the signal processing circuit includes:

a signal generator configured to generate the plurality of ramping up/down signals;

a selection circuit configured to output the selected ramping up/down signal in response to at least one control signal; and a comparison circuit configured to perform a correlated double sampling of the pixel signal, to perform a correlated double sampling of the first ramping up/down signal, to compare the correlated double sampled pixel signal with the correlated double sampled first ramping up/down signal at one or more sampling times between the reset interval and the image interval, and to generate the at least one control signal according to a result of the comparison.

7. The device of claim 6, wherein the selected ramping up/down signal is a second ramping up/down signal which is different from the first ramping up/down signal.

8. The device of claim 6, wherein the selected ramping up/down signal is the first ramping up/down signal.

9. The device of claim 6, wherein the signal generator includes a plurality of ramping up/down signal generators each generating a pair of corresponding differential ramping up/down signals among the plurality of ramping up/down signals.

10. The device of claim 6, further comprising an image signal processor processing an output signal of the image sensor.

11. A signal processing device for processing a pixel signal produced by a pixel of an image sensor, the signal processing device comprising:

a signal generator configured to generate a plurality of ramping up/down signals;

a selection circuit configured to receive the plurality of ramping up/down signals and to output a selected ramping up/down signal among the plurality of ramping up/down signals in response to at least one control signal; and a correlated double sampling circuit configured to perform a correlated double sampling operation on the pixel signal and the selected ramping up/down signal, and to output a correlated double sampled output signal having a first level when a correlated double sampled pixel signal is greater than a correlated double sampled selected ramping up/down signal, and to output the correlated double sampled output signal having a second level when the correlated double sampled pixel signal is less than the correlated double sampled selected ramping up/down signal, wherein the correlated double sampling circuit is configured to perform the correlated double sampling operation on the pixel signal and the selected ramping up/down signal, and to output the correlated double sampled output signal, at least once between a reset interval of the pixel and an image interval of the pixel, wherein the correlated double sampling circuit is further configured to perform the correlated double sampling operation of the pixel signal and the selected ramping up/down signal at least once during the image interval of the sensor, and wherein the correlated double sampled output signal which is output by the correlated double sampling circuit between the reset interval of the pixel and the image interval of the pixel generates the at least one control signal for the selection circuit while the correlated double sampling circuit performs the correlated double sampling operation on the pixel signal and the selected ramping up/down signal during the image interval of the pixel.

12. The signal processing device of claim 11, further comprising:

a comparator connected to receive the correlated double sampled output signal from the correlated double sampling circuit and to receive a reference voltage, and which is configured to compare the correlated double sampled output signal to the reference voltage and to output a comparison signal in response to the comparison; and a memory device configured to receive and latch the comparison signal, and to output the comparison signal as the at least one control signal.

13. The signal processing device of claim 12, further comprising a counter connected to receive the comparison signal and to count a time period between a start of the image interval and a transition of the comparison signal from a first level to a second level as a result of the comparison.

14. The signal processing device of claim 11, wherein the correlated double sampling circuit is configured to perform the correlated double sampling of the pixel signal and the selected ramping up/down signal, and to output the correlated double sampled output signal, at least twice between the reset interval of the pixel and the image interval of the pixel.

15. The signal processing device of claim 11, wherein at least one of the ramping up/down signals comprises a signal which has a ramp-up portion and a ramp-down portion during the image interval.

* * * * *